(12) United States Patent
Roh

(10) Patent No.: US 11,137,649 B2
(45) Date of Patent: Oct. 5, 2021

(54) DISPLAY DEVICE

(71) Applicant: Samsung Display Co., Ltd., Yongin-si (KR)

(72) Inventor: Myong Hoon Roh, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/735,100

(22) Filed: Jan. 6, 2020

(65) Prior Publication Data

US 2020/0271979 A1    Aug. 27, 2020

(30) Foreign Application Priority Data

Feb. 21, 2019    (KR) .................... 10-2019-0020781

(51) Int. Cl.
| | |
|---|---|
| *G02F 1/1345* | (2006.01) |
| *H01L 23/00* | (2006.01) |
| *H05K 1/11* | (2006.01) |
| *H01L 23/498* | (2006.01) |
| *H05K 1/18* | (2006.01) |
| *H01L 27/32* | (2006.01) |

(52) U.S. Cl.
CPC ...... *G02F 1/13458* (2013.01); *G02F 1/13452* (2013.01); *H01L 23/49838* (2013.01); *H01L 24/05* (2013.01); *H01L 24/48* (2013.01); *H01L 27/3276* (2013.01); *H05K 1/111* (2013.01); *H05K 1/189* (2013.01); *H01L 2224/81132* (2013.01); *H05K 2201/09372* (2013.01); *H05K 2201/09954* (2013.01); *H05K 2201/10128* (2013.01); *H05K 2203/049* (2013.01); *H05K 2203/166* (2013.01)

(58) Field of Classification Search
None
See application file for complete search history.

(56) References Cited

U.S. PATENT DOCUMENTS

| | | | |
|---|---|---|---|
| 8,896,798 B2 | 11/2014 | Wang et al. | |
| 9,591,754 B2 | 3/2017 | Lee | |
| 2018/0090442 A1* | 3/2018 | Li | H01L 23/5386 |
| 2019/0393277 A1* | 12/2019 | An | H01L 27/3276 |
| 2020/0013330 A1 | 1/2020 | Kim | |
| 2020/0272007 A1* | 8/2020 | Yang | G02F 1/1362 |

FOREIGN PATENT DOCUMENTS

| | | |
|---|---|---|
| CN | 108495455 | 9/2018 |
| JP | 2005252226 | 9/2005 |
| KR | 1020070063644 | 6/2007 |
| KR | 1020200004932 | 1/2020 |

* cited by examiner

*Primary Examiner* — James A Dudek
(74) *Attorney, Agent, or Firm* — Cantor Colburn LLP

(57) ABSTRACT

A display device includes a display substrate including a display area and a pad area, which is disposed on the periphery of the display area; and a display panel including at least one wire pad, which is disposed in the pad area of the display substrate, where the wire pad includes a main pad portion, which extends in a first direction, a first protruding pad portion, which protrudes from a first side, in a second direction intersecting the first direction, of the main pad portion, and a second protruding pad portion, which protrudes from a second side, in the second direction, of the main pad portion, and the first protruding pad portion is disposed closer than the second protruding pad portion to the display area.

20 Claims, 25 Drawing Sheets

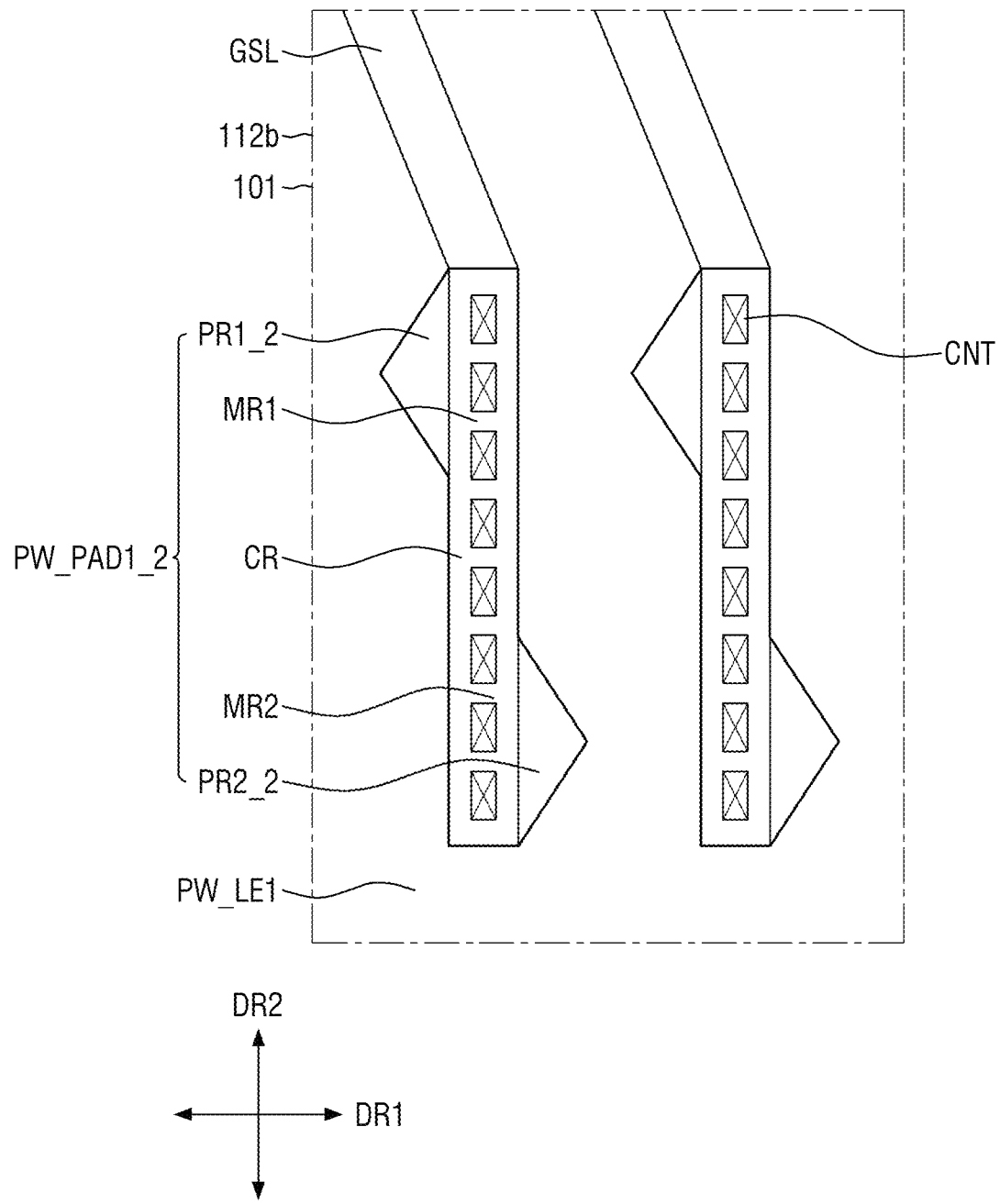

DISPLAY DEVICE

This application claims priority to Korean Patent Application No. 10-2019-0020781, filed on Feb. 21, 2019, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

A display device visually displays data. The display device includes a substrate which is divided into a display area and a non-display area. In the display area, a plurality of pixels is disposed on the substrate, and in the non-display area, a plurality of pads is disposed on the substrate. A chip-on-film ("COF") with driving circuits and the like mounted thereon is coupled to the pads which transmit driving signals to the pixels.

The COF includes a plurality of leads which are coupled to the pads, and the leads may be bonded to separate pads. The bonding of the leads may be performed using an ultrasonic bonding process.

SUMMARY

However, when a degree of a misalignment differs between leads and pads in a bonding process during a manufacture of each display device, an overall bonding area between the leads and the pads may vary from one display device to another display device, and as a result, a chip-on-film ("COF") bonding defects or resistance irregularities in bonding parts may occur.

Exemplary embodiments of the invention provide a display device including a uniform bonding area between lead wires and panel pads.

However, exemplary embodiments of the invention are not restricted to those set forth herein. The above and other exemplary embodiments of the invention will become more apparent to one of ordinary skill in the art to which the invention pertains by referencing the detailed description of the invention given below.

An exemplary embodiment of the invention provides a display device including a display substrate including a display area and a pad area, which is disposed on a periphery of the display area, and a display panel including a wire pad, which is disposed in the pad area of the display substrate, where the wire pad includes a main pad portion, which extends in a first direction, a first protruding pad portion, which protrudes from a first side, in a second direction intersecting the first direction, of the main pad portion, and a second protruding pad portion, which protrudes from a second side, in the second direction, of the main pad portion, and the first protruding pad portion is disposed closer than the second protruding pad portion to the display area.

In an exemplary embodiment, the first direction may be a direction from the display area toward an end of the pad area where the wire pad is disposed, and the second side, in the second direction, of the main pad portion may be opposite to the first side, in the second direction, of the main pad portion.

In an exemplary embodiment, the wire pad may further include a third protruding pad portion, which protrudes from the first side, in the second direction, of the main pad portion, and a fourth protruding pad portion, which protrudes from the second side, in the second direction, of the main pad portion.

In an exemplary embodiment, the third protruding pad portion may be disposed between the second and fourth protruding pad portions and may be disposed closer than the fourth protruding pad portion to the display area.

In an exemplary embodiment, the second protruding pad portion may be disposed between the third and fourth protruding pad portions, and the third protruding pad portion may be located closer than the fourth protruding pad portion to the display area.

In an exemplary embodiment, the wire pad may further include a third protruding pad portion, which protrudes from the second side, in the second direction, of the main pad portion, and an area of the first protruding pad portion is the same as areas of the second and third protruding pad portions.

In an exemplary embodiment, the main pad portion may include a first sub-main pad portion, which is disposed on a second side, in the second direction, of the first protruding pad portion, and a second sub-main pad portion, which is disposed on a first side, in the second direction, of the second protruding pad portion and is spaced apart from the first sub-main pad portion in the first direction.

In an exemplary embodiment, the first and second protruding pad portions may have the same area and the same shape with each other.

In an exemplary embodiment, the display device may further include a printed circuit board attached on the pad area of the display substrate and including a lead wire, which is connected to the wire pad.

In an exemplary embodiment, the lead wire may overlap with the main pad portion of the wire pad in a thickness direction and at least partially overlap with at least one of the first protruding pad portion and the second protruding pad portion in the thickness direction.

In an exemplary embodiment, the lead wire may be directly connected to the wire pad.

In an exemplary embodiment, the lead wire may be ultrasonic-bonded to the wire pad.

In an exemplary embodiment, the wire pad may overlap, in a thickness direction, with, and may be electrically connected to, a signal wire, which passes through the display area, and the signal wire is a gate signal wire.

In an exemplary embodiment, the display device may further include a pad insulating film which is disposed between the signal wire and the wire pad of the pad area and in which a plurality of contact holes that at least partially expose the signal wire is defined, where the wire pad is electrically connected to the signal wire through the plurality of contact holes.

In an exemplary embodiment, a plurality of wire pads may be arranged along the first direction and include a power wire pad, which is electrically connected to a power voltage line in the display area through a signal wire, and a data wire pad, which is electrically connected to a data line in the display area through the signal wire.

In an exemplary embodiment, the display device may further include a panel alignment mark which is disposed on a first side, in the first direction, of an array of the plurality of wire pads and in which an alignment hole is defined.

In an exemplary embodiment, the printed circuit board may include a circuit alignment mark, which is ultrasonic-bonded to the panel alignment mark and includes a circuit alignment hole therein.

An exemplary embodiment of the invention provides a display device including a display area, which includes a thin-film transistor, and a pad area, which is disposed on a periphery of the display area, the display device including a substrate, a first conductive layer disposed on the substrate, a first insulating layer disposed on the first conductive layer, a second conductive layer disposed on the first insulating layer, a second insulating layer disposed on the second conductive layer, and a third conductive layer disposed on the second insulating layer, where the first conductive layer includes a gate electrode of the thin-film transistor, which is disposed in the display area, and a gate signal wire, which is disposed in the pad area, the second conductive layer includes source and drain electrodes of the thin-film transistor and a plurality of wire pads, which are disposed in the pad area, the plurality of wire pads overlaps, in a thickness direction, with, and is electrically connected to, the gate signal wire, each of the plurality of wire pads includes a main pad portion, which extends in a first direction, a first protruding pad portion, which protrudes from a first side, in a second direction that intersects the first direction, of the main pad portion, and a second protruding pad portion, which protrudes from a second side, in the second direction, of the main pad portion, and the first protruding pad portion is located closer than the second protruding pad portion to the display area.

In an exemplary embodiment, the first direction may be a direction from the display area toward an end of the pad area where the plurality of wire pads is disposed, and the second side, in the second direction, of the main pad portion may be opposite to the first side, in the second direction, of the main pad portion.

In an exemplary embodiment, the display device may further include a printed circuit board attached on the pad area of the display substrate and including lead wires, which are connected to the plurality of wire pads, where the lead wires overlap with main pad portions of the plurality of wire pads in the thickness direction and at least partially overlap with at least one of first protruding pad portions and second protruding pad portions of the plurality of wire pads in the thickness direction.

Other features and embodiments may be apparent from the following detailed description, the drawings, and the claims.

BRIEF DESCRIPTION OF THE DRAWINGS

The above and other exemplary embodiments and features of the invention will become more apparent by describing in detail embodiments thereof with reference to the attached drawings, in which:

FIGS. 16A through 16C are enlarged plan views illustrating an exemplary embodiment of pad areas of display devices according to the invention;

DETAILED DESCRIPTION

Figure 1:
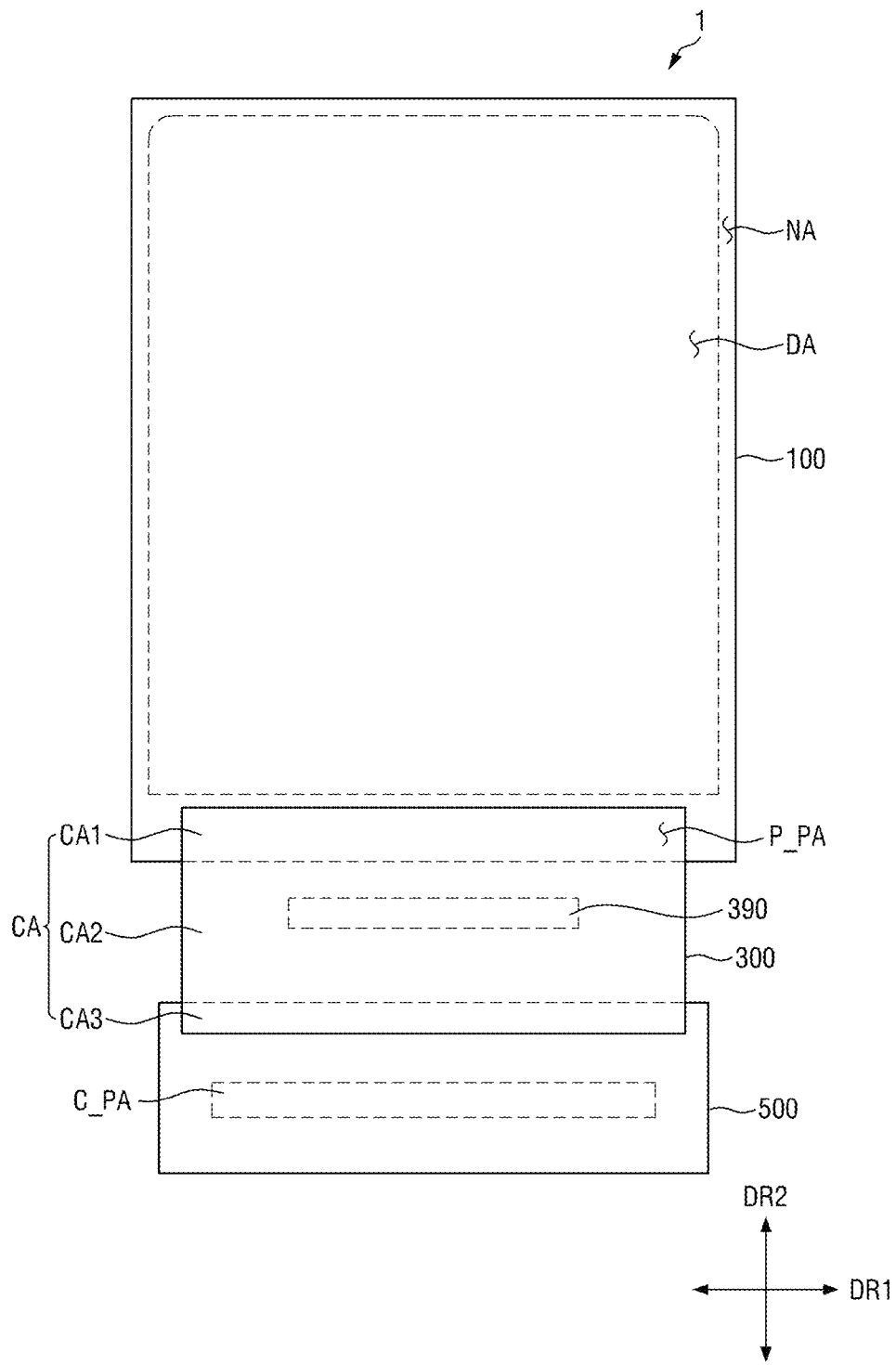
FIG. 1 is a plan view of an exemplary embodiment of a display device according to the invention.

It will be understood that when an element is referred to as being "on" another element, it may be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Drawing figures. It will be understood that relative terms are intended to encompass different orientations of the device in addition to the orientation depicted in the Drawing figures. In an exemplary embodiment, when the device in one of the drawing figures is turned over, elements described as being on the "lower" side of other elements would then be oriented on "upper" sides of the other elements. The exemplary term "lower," may therefore, encompasses both an orientation of "lower" and "upper," depending on the particular orientation of the figure. Similarly, when the device in one of the drawing figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. In an exemplary embodiment, when the device in the drawing figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). In an exemplary embodiment, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the drawing figures are schematic in nature and their shapes are not intended to illustrate the precise shape of a region and are not intended to limit the scope of the claims.

Figure 2A:
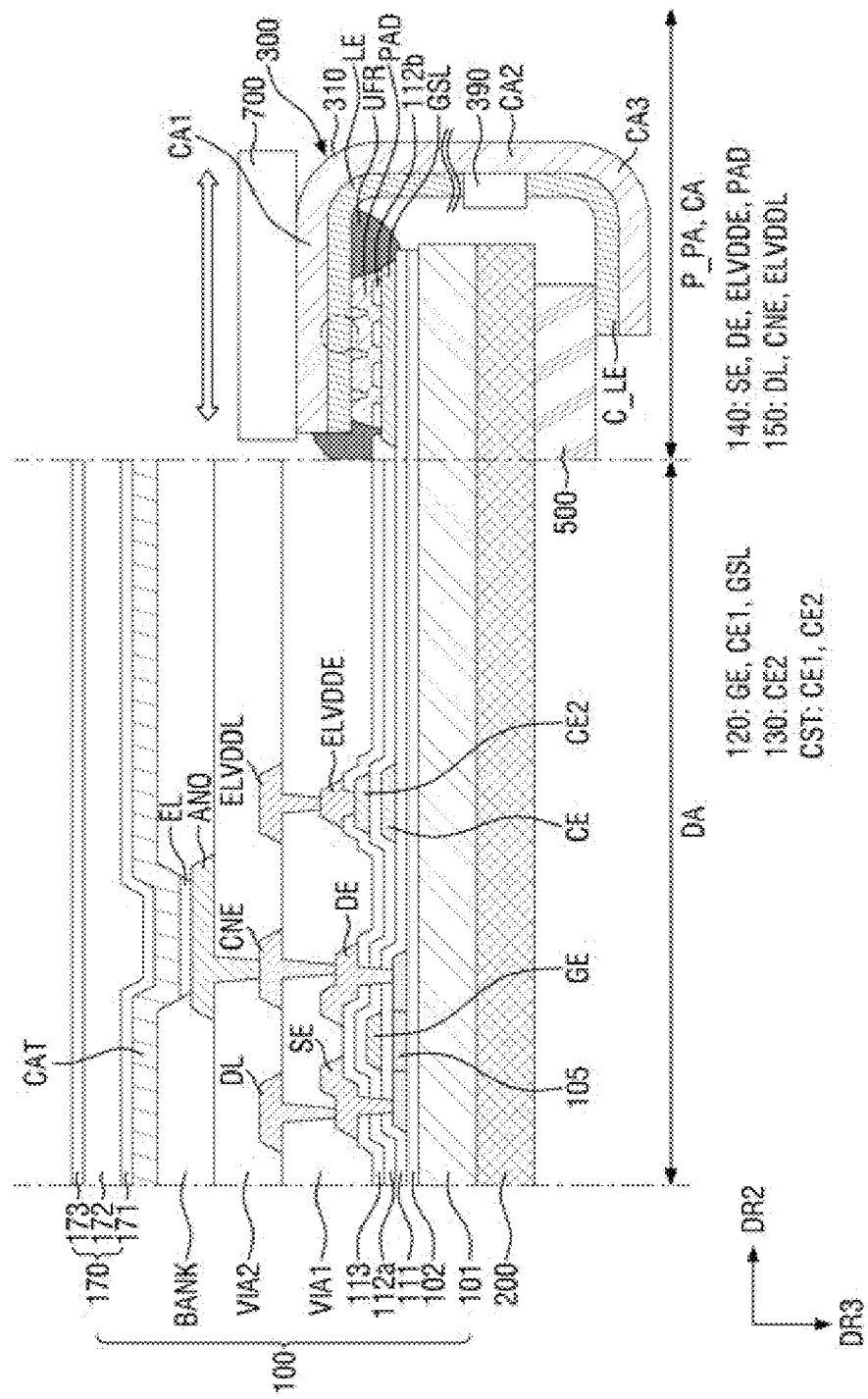
FIG. 2A is a cross-sectional view of the display device of FIG. 1, and FIGS. 2B and 2C are enlarged views of portions of the display device in FIG. 2A.
Figure 3:
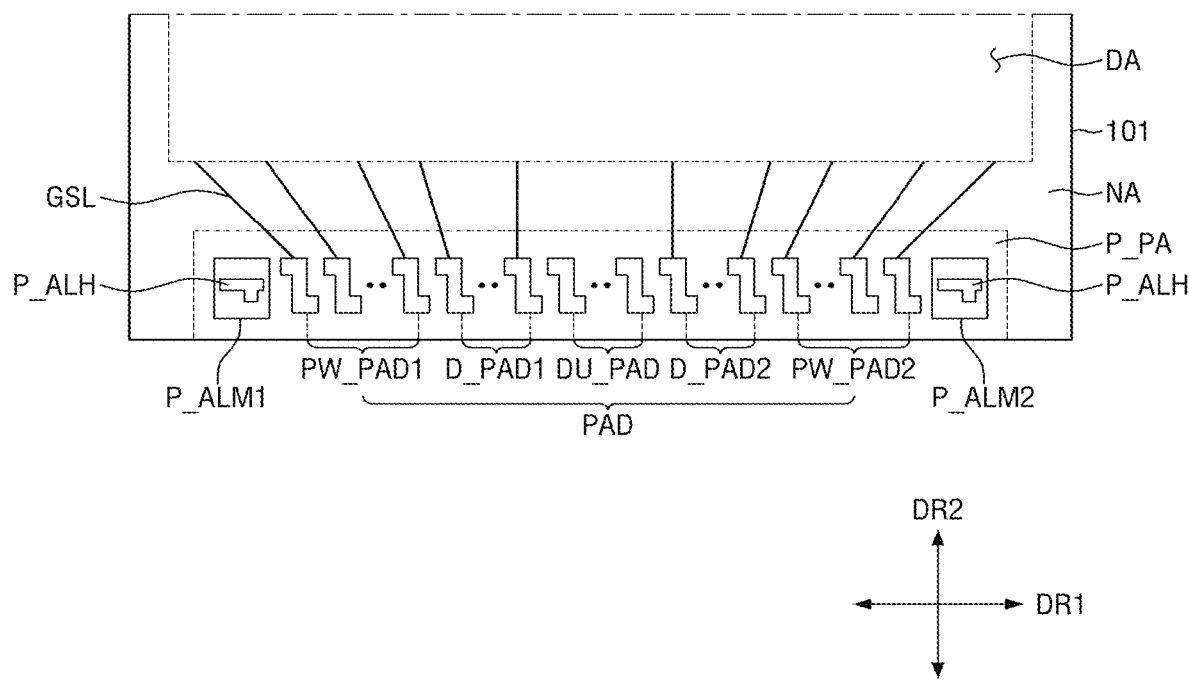
FIG. 3 is a plan view illustrating a pad area of the display device of FIG. 1.
Figure 4:
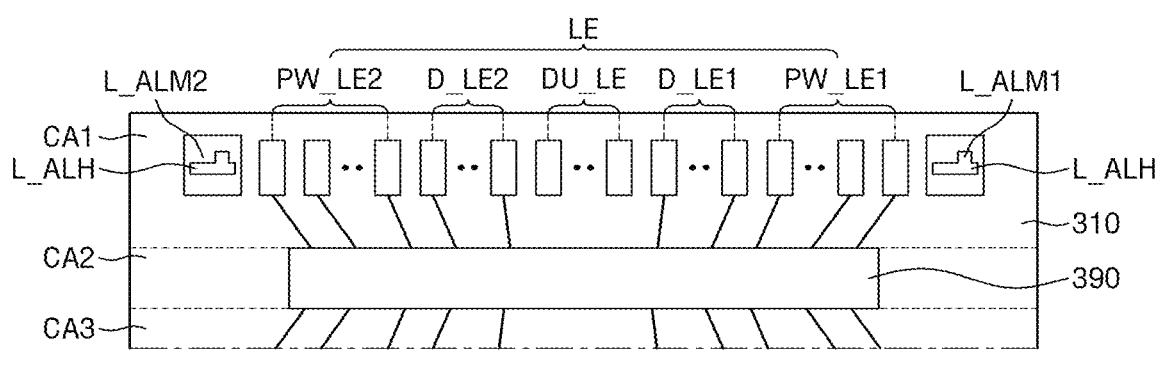
FIG. 4 is a partial plan view illustrating a printed circuit board ("PCB") of the display device of FIG. 1.

FIG. 1 is a plan view of a display device according to an exemplary embodiment of the invention, FIG. 2A is a cross-sectional view of the display device of FIG. 1, FIG. 3 is a plan view illustrating a pad area of the display device of FIG. 1, and FIG. 4 is a partial plan view illustrating a printed circuit board ("PCB") of the display device of FIG. 1. Specifically, FIG. 2A is a cross-sectional view illustrating a pixel area and a panel pad area P_PA of FIG. 1.

A display device 1, which is a device displaying still or moving images, may be used in portable electronic devices such as a mobile phone, a smartphone, a tablet personal computer ("PC"), a smart watch, a watch phone, a mobile communication terminal, an electronic notebook, an electronic book, a portable multimedia player ("PMP"), a navigation device, or an ultra-mobile PC ("UMPC"), but also in various other products such as a television ("TV"), a notebook computer, a monitor, a billboard, or an Internet-of-Things ("IoT") device.

Referring to FIGS. 1 through 4, the display device 1 may include a display panel 100, which displays images, a PCB 300, which is connected to the display panel 100, and a main circuit board 500, which is connected to the PCB 300.

In an exemplary embodiment, an organic light-emitting diode ("OLED") display panel may be used as the display panel 100, for example. The display panel 100 will hereinafter be described as being an OLED display panel, but the invention is not limited thereto. In an alternative exemplary embodiment, various other display panels such as a liquid crystal display ("LCD") panel, a quantum dot-OLED ("QD-OLED") display panel, a quantum dot-LCD ("QD-LCD"), quantum-dot nano-light-emitting diode ("QNED") display panel, or a micro-LED ("mLED") display panel may be used as the display panel 100.

The display panel 100 includes a display area DA which includes a plurality of pixel areas and a non-display area NA which is disposed on the periphery of the display area DA. The display area DA may have a rectangular shape with right-angled corners or with rounded corners in a plan view. The display area DA may have short sides and long sides. The short sides of the display area DA may extend in a first direction DR1. The long sides of the display area DA may extend in a second direction DR2. The planar shape of the display area DA is not particularly limited, and the display area DA may have various shapes other than a rectangular shape, such as a circular shape, an elliptical shape, and the like. The non-display area NA may be disposed adjacent to both short sides and both long sides of the display area DA, in which case, the non-display area NA may surround all the sides of the display area DA and may form the edges of the display area DA. However, the invention is not limited thereto. In an alternative exemplary embodiment, the non-display area NA may be disposed adjacent only to both short sides or both long sides of the display area DA.

The non-display area NA of the display panel 100 may include a panel pad area P_PA. The panel pad area P_PA may be disposed adjacent to one of the short sides of the display area DA, but the invention is not limited thereto. In an alternative exemplary embodiment, the panel pad area P_PA may be disposed adjacent to both short sides and/or both long sides of the display area DA.

The PCB 300 may include a printed base film 310 and a driver integrated circuit ("IC") 390 which is disposed on the printed base film 310. The printed base film 310 may include an insulating material.

The PCB 300 may include a first circuit area CA1 which is attached to the panel pad area P_PA of the display panel 100, a second circuit area CA2 which is disposed on a first side (e.g., lower side), in the second direction DR2, of the first circuit area CA1, and a third circuit area CA3 which is disposed on a first side, in the second direction DR2, of the second circuit area CA2 and to which the main circuit board 500 is attached. The driver IC 390 may be disposed on a first surface of the second circuit area CA2 of the PCB 300. In an exemplary embodiment, the driver IC 390 may be, for example, a data driver IC and may be implemented in a chip-on-film ("COF") manner, for example.

The main circuit board 500 may include a circuit pad area C_PA which is attached to the third circuit area CA3 of the PCB 300. In the circuit pad area C_PA of the main circuit board 500, a plurality of circuit pads may be disposed and may be connected to a lead wire disposed in the third circuit area CA3 of the PCB 300.

Referring to FIG. 2A, the display device 1 may further include a panel bottom sheet 200 which is disposed at the bottom of the display panel 100. The panel bottom sheet 200 may be attached to the rear surface of the display panel 100. The panel bottom sheet 200 may include one or more functional layers. The functional layers may be layers that perform a heat dissipation function, an electromagnetic wave shielding function, a grounding function, a buffering function, a strength enhancement function, a support function, and/or a digitizing function. The functional layers may be sheet layers including sheets, film layers including films, thin-film layers, coating layers, panels, or plates. The functional layers may have a single-layer structure or a stack of multiple thin films or coating layers. The functional layers may be, for example, supporting members, heat dissipation layers, electromagnetic wave shielding layers, impact absorbing layers, or digitizers.

The PCB 300 may be bent in a downward direction in a third direction DR3, as illustrated in FIG. 2A. A part of the PCB 300 and the main circuit board 500 may be disposed below the panel bottom sheet 200. The bottom surface of the panel bottom sheet 200 may be coupled to the main circuit board 500 via an adhesive layer, but the invention is not limited thereto.

The display panel 100 may include a display substrate 101, a plurality of conductive layers, a plurality of insulating layers for insulating the conductive layers, and an organic layer EL.

The display substrate 101 may be disposed in and across the display area DA and the non-display area NA. The display substrate 101 may support various elements disposed thereabove. The display substrate 101 may be a rigid substrate including a rigid material such as soft glass, quartz, or the like, but the invention is not limited thereto. In an alternative exemplary embodiment, the display substrate 101 may be a flexible substrate including a flexible material such as polyimide ("PI") or the like.

A buffer layer 102 may be disposed on the display substrate 101. The buffer layer 102 may prevent the penetration of external moisture and oxygen through the display substrate 101. In an exemplary embodiment, the buffer layer 102 may include at least one of a silicon nitride (SiNx) film, a silicon oxide ($SiO_2$) film, and a silicon oxynitride (SiOxNy) film, for example.

A semiconductor layer 105 may be disposed on the buffer layer 102. The semiconductor layer 105 may form the channel of a thin-film transistor ("TFT"). The semiconductor layer 105 may be disposed in each pixel in the display area DA and even in the non-display area NA, when necessary. The semiconductor layer 105 may include source/drain regions and an active region. In an exemplary embodiment, the semiconductor layer 105 may include polycrystalline silicon, for example.

A first insulating layer 111 may be disposed on the semiconductor layer 105. The first insulating layer 111 may be disposed on the entire surface of the display substrate 101. The first insulating layer 111 may be a gate insulating film having a gate insulation function. In an exemplary embodiment, the first insulating layer 111 may include a silicon compound, a metal oxide, or the like. In an exemplary embodiment, the first insulating layer 111 may include silicon oxide, silicon nitride, silicon oxynitride, aluminum oxide, tantalum oxide, hafnium oxide, zirconium oxide, titanium oxide, or the like, and these materials may be used alone or in combination with one another, for example.

A first conductive layer 120 may be disposed on the first insulating layer 111. The first conductive layer 120 may include a gate electrode GE of the TFT, a first electrode CE1 of a sustain capacitor Cst, and a gate signal wire GSL. In an exemplary embodiment, the first conductive layer 120 may include at least one metal including at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), for example. The first conductive layer 120 may be a single-layer film or a stack of multiple films.

A second insulating layer (112a and 112b) may be disposed on the first conductive layer 120. The second insulating layer (112a and 112b) may insulate the first conductive layer 120 from a second conductive layer 130. The second insulating layer (112a and 112b) may include at least one of the aforementioned exemplary materials of the first insulating layer 111. In the panel pad area P_PA, a plurality of contact holes CNT (refer to FIG. 6) which partially expose the gate signal wire GSL may be defined in the second insulating layer 112b.

The second conductive layer 130 may be disposed on the second insulating layer (112a and 112b). The second conductive layer 130 may include a second electrode CE2 of the sustain capacitor Cst. The second conductive layer 130 may include at least one of the aforementioned exemplary materials of the first conductive material. The first and second electrodes CE1 and CE2 of the sustain capacitor Cst may form a capacitor through the second insulating layer (112a and 112b).

A third insulating layer 113 may be disposed on the second conductive layer 130. The third insulating layer 113 may include at least one of the aforementioned exemplary materials of the first insulating layer 111. In some exemplary embodiments, the third insulating layer 113 may include an organic insulating material. The organic insulating material may include at least one of the exemplary materials of a first via layer VIA1 that will be described later.

A third conductive layer 140 may be disposed on the third insulating layer 113. The third conductive layer 140 may include a source electrode SE, a drain electrode DE, a high-potential voltage electrode ELVDDE, and a wire pad PAD. In an exemplary embodiment, the third conductive layer 140 may include at least one of Mo, Al, Pt, Pd, Ag, Mg, Au, Ni, Nd, Ir, Cr, Ca, Ti, Ta, W, and Cu, for example. The third conductive layer 140 may be a single-layer film, but the invention is not limited thereto. In an alternative exemplary embodiment, the third conductive layer 140 may be a stack of multiple films. In an exemplary embodiment, the third conductive layer 140 may have a stack structure of Ti/Al/Ti, Mo/Al/Mo, Mo/AlGe/Mo, or Ti/Cu, for example.

The wire pad PAD of the third conductive layer 140 may overlap with the gate signal wire GSL of the first conductive layer 120 in a thickness direction and may be electrically connected to the gate signal wire GSL through the contact holes CNT of the second insulating layer 112b. The wire pad PAD may include surface irregularities. Protruding parts of the wire pad PAD may be parts of the wire pad PAD that overlap with the second insulating layer 112b in the thickness direction, and recessed parts of the wire pad PAD may be parts of the wire pad PAD that do not overlap with the second insulating layer 112b in the thickness direction.

The first via layer VIA1 may be disposed on the third conductive layer 140. The first via layer VIA1 may include an organic insulating material. In an exemplary embodiment, the organic insulating material may include at least one of an acrylic resin, an epoxy resin, a phenolic resin, a polyamide resin, a polyimide resin, an unsaturated polyester resin, a polyphenylene resin, a polyphenylene sulfide resin, and benzocyclobutene ("BCB"), for example.

The structure that overlies the third conductive layer 140, for example, the first via layer VIA1 and elements disposed on the first via layer VIA1 that will be described later, may not be provided in, or may be removed from, the panel pad area P_PA. As a result, the top surface of the wire pad PAD may be exposed in the panel pad area P_PA.

The PCB 300 may further include a lead wire LE which is disposed on a first surface of the first circuit area CA1 and a circuit lead wire C_LE which is disposed on a first surface of the third circuit area CA3. The lead wire LE is connected to the wire pad PAD. The lead wire LE may be connected directly to the top surface of the wire pad PAD that is exposed. In an exemplary embodiment, the lead wire LE may be coupled to the wire pad PAD by an ultrasonic bonding process, for example.

The ultrasonic bonding process may be performed by an ultrasonic device 700. The ultrasonic device 700 may include a vibration generator 710, a vibrator 720 which is connected to the vibration generator 710, a pressurizer 730 which amplifies the amplitude of vibration of the vibrator 720, and a vibration transmitter 740 which is connected to the vibrator 720.

The vibration generator 710 may convert electrical energy into vibrational energy. The vibrator 720 may vibrate with the vibrational energy obtained by the vibration generator 710. The vibrator 720 may vibrate with a predetermined vibration direction and a predetermined amplitude. The amplitude of vibration of the vibrator 720 may be amplified in the predetermined vibration direction by the pressurizer 730, which is connected to the vibrator 720. The vibration transmitter 740 may transmit the vibration of the vibrator 720 to a target element to be bonded. A supporting member 750 may fix the top and bottom surfaces of the vibrator 720 and may thus prevent the vibrator 720 and the vibration transmitter 740 from fluctuating vertically due to the vibration of the vibrator 720.

Figure 2B:
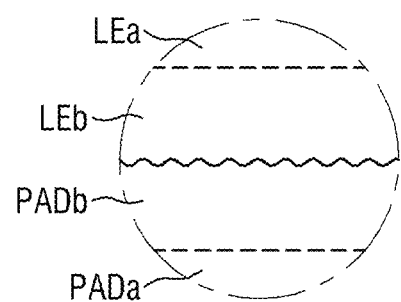
Figure 2C:
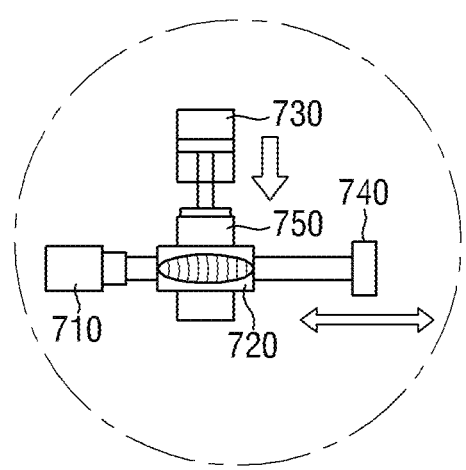

The ultrasonic device 700 may be in contact with a second surface of the PCB 300 and may maintain a predetermined pressurization state in a downward direction such that the vibration transmitter 740 may effectively transmit the vibration of the vibrator 720 to the PCB 300. The vibration transmitter 740 of the ultrasonic device 700 may overlap with the entire PCB 300, which is disposed below the ultrasonic device 700, as illustrated in FIG. 2C, and may perform ultrasonic bonding.

The ultrasonic device 700 may vibrate in the predetermined vibration direction to vibrate the lead wire LE in the predetermined vibration direction. In this case, the wire pad PAD may also vibrate slightly in the same direction as the lead wire LE due to the vibration applied thereto through the lead wire LE, but the amplitude of vibration of the wire pad PAD may be ignorable. Thus, the amplitude of vibration of the vibration transmission unit 740 in the predetermined vibration direction may be substantially the same as the distance by which the lead wire LE is moved over the wire pad PAD. The predetermined vibration direction may be the second direction DR2. That is, the predetermined vibration direction may be the direction in which the wire pad PAD and the lead wire LE extend.

If the lead wire LE is vibrated over the wire pad PAD using ultrasonic waves, a predetermined friction force is generated at the interface between the wire pad PAD and the lead wire LE, and as a result, friction heat may be generated. When the friction heat is sufficient to melt the materials of the wire pad PAD and the lead wire LE, a melted pad area PADb of the wire pad PAD that is adjacent to the lead wire LE and a melted lead area LEb of the lead wire LE that is adjacent to the pad area PAD may be melted. That is, the wire pad PAD may include a non-melted pad area PADa and the melted pad area PADb, and the lead wire LE may include a non-melted lead area LEa and the melted lead area LEb.

The non-melted pad area PADa may be an area including only the material of the wire pad PAD. The non-melted lead area LEa may be an area including only the material of the lead wire LE.

The melted pad area PADb may be an area in which the material of the lead wire LE is diffused to be mixed with the material of the wire pad PAD, and the melted lead area LEb may be an area in which the material of the wire pad PAD is diffused to be mixed with the material of the wire pad PAD. In an exemplary embodiment, in a case where the lead wire LE includes Ag, Au, or Cu and the wire pad PAD includes Ti/Al/Ti, the melted pad area PADb may be an area in which Ti and/or Al from the wire pad PAD and Ag, Au, or Cu from the lead wire LE are mixed together, and the melted lead area LEb may be an area in which Ag, Au, or Cu from the lead wire LE and Ti and/or Al from the wire pad PAD are mixed together, for example.

In the melted pad area PADb and the melted lead area LEb, the wire pad PAD and the lead wire LE solidify and are then bonded together. The interface between the wire pad PAD and the lead wire LE, i.e., the interface between the melted pad area PADb and the melted lead area LEb, may have a non-flat shape.

In an area where the wire pad PAD and the PCB 300 are not surface-bonded together between the wire pad PAD and the PCB 300, an under-filling resin UFR may be disposed and may facilitate the bonding between the wire pad PAD and the PCB 300. That is, the under-filling resin UFR may bond the wire pad PAD and the lead wire LE together in areas other than an ultrasonic-bonded area, as illustrated in FIG. 2B. A typical adhesive material may be used as the under-filling resin UFR. In an exemplary embodiment, an organic resin may be used as the under-filling resin UFR, for example.

A fourth conductive layer 150 may be disposed on the first via layer VIA1. The fourth conductive layer 150 may include a data line DL, a connecting electrode CNE, and a high-potential voltage wire ELVDDL. The data line DL may be electrically connected to the source electrode SE of the TFT through a contact that penetrates the first via layer VIA1. The connecting electrode CNE may be electrically connected to the drain electrode DE of the TFT through a contact hole that penetrates the first via layer VIA1. The high-potential voltage wire ELVDDL may be electrically connected to the high-potential voltage electrode ELVDDE through a contact hole that penetrates the first via layer VIA1. The fourth conductive layer 150 may include at least one of the aforementioned exemplary materials of the third conductive layer 140.

A second via layer VIA2 is disposed on the fourth conductive layer 150. The second via layer VIA2 may include at least one of the aforementioned exemplary materials of the first via layer VIA1.

An anode electrode ANO is disposed on the second via layer VIA2. The anode electrode ANO may be electrically connected to the connecting electrode CNE through a contact hole that penetrates the second via layer VIA2.

A bank layer BANK may be disposed on the anode electrode ANO. The bank layer BANK may include an opening that exposes the anode electrode ANO. The bank layer BANK may include an organic insulating material or an inorganic insulating material. In an exemplary embodiment, the bank layer BANK may include at least one of photoresist, a polyimide resin, an acrylic resin, a silicon compound, and a polyacrylic resin, for example.

The organic layer EL may be disposed on the top surface of the anode electrode ANO and in the opening of the bank layer BANK. A cathode electrode CAT is disposed on the organic layer EL and the bank layer BANK. The cathode electrode CAT may be a common electrode disposed in and across the plurality of pixel areas.

A thin-film encapsulation layer 170 is disposed on the cathode electrode CAT. The thin-film encapsulation layer 170 may cover an OLED. The thin-film encapsulation layer 170 may be a layer in which an inorganic film and an organic film are alternately stacked. In an exemplary embodiment, the thin-film encapsulation layer 170 may include a first encapsulation inorganic film 171, an encapsulation organic film 172, and a second encapsulation inorganic film 173 that are sequentially stacked, for example.

The structure and the shape of the stack of the gate signal wire GSL and the wire pad PAD in the panel pad area P_PA may vary.

In an exemplary embodiment, in some exemplary embodiments, the gate signal wire GSL may include a plurality of patterns, and the wire pad PAD, which is disposed on the gate signal wire GSL, may have surface irregularities reflecting height differences provided by the patterns of the gate signal wire GSL, for example.

In some exemplary embodiments, an auxiliary pad of the second conductive layer 130 may be further disposed between the gate signal wire GSL and the wire pad PAD. In this case, the size of the auxiliary pad may be smaller than the size of the wire pad PAD. The wire pad PAD, the auxiliary pad, and the gate signal wire GSL may overlap with one another in the thickness direction and may be electrically connected to one another.

Also, in some exemplary embodiments, the gate signal wire GSL may be provided as the second conductive layer 130, and the wire pad PAD may be provided as the fourth conductive layer 150.

Referring to FIG. 3, a plurality of wire pads PAD may be provided and may be arranged along the first direction DR1.

The wire pads PAD may include a plurality of power pads (PW_PAD1 and PW_PAD2), a plurality of data pads (D_PAD1 and D_PAD2), and a plurality of panel dummy pad DU_PAD. The power pads (PW_PAD1 and PW_PAD2) may be electrically connected through gate signal wires GSL and high-potential voltage wires ELVDDL and/or low-potential voltage wires, and the data pads (D_PAD1 and D_PAD2) may be electrically connected through the data line DL and the gate signal wires GSL. The panel dummy pads DU_PAD may be isolated from signal wires that pass through the display area DA.

The array of the panel dummy pads DU_PAD may be disposed between the array of first data pads D_PAD1 and the array of second data pads D_PAD2, and the array of the first data pads D_PAD1 may be disposed between the array of first power pads PW_PAD1 and the array of the dummy pads DU_PAD, and the array of the second data pads D_PAD2 may be disposed between the array of second power pads PW_PAD2 and the array of the dummy pads DU_PAD.

Each of the wire pads PAD may protrude in two different directions. In an exemplary embodiment, each of the wire pads PAD may protrude on both sides thereof in the first direction DR1. The shape of the wire pads PAD will be described later in detail, for example.

Panel alignment marks (P_ALM1 and P_ALM2) may be disposed on both sides of the array of the wire pads PAD. That is, a first panel alignment mark P_ALM1 may be disposed on a first side, in the first direction DR1, of the array of the wire pads PAD, and a second panel alignment mark P_ALM2 may be disposed on a second side, in the first direction DR1, of the array of the wire pads PAD. The panel alignment marks (P_ALM1 and P_ALM2) may serve as markers in the process of attaching the PCB 300.

The panel alignment marks (P_ALM1 and P_ALM2) may have the same stack structure as, or a similar stack structure to, the wire pads PAD, but the invention is not limited thereto. In an alternative exemplary embodiment, the panel alignment marks (P_ALM1 and P_ALM2) may consist only of the gate signal wires GSL or only of the wire pads PAD. Also, the panel alignment marks (P_ALM1 and P_ALM2) may include different conductive layers from the gate signal wires GSL and the wire pads PAD.

Alignment holes P_ALH may be defined in the panel alignment marks (P_ALM1 and P_ALM2). In a plan view, the alignment holes P_ALH may be completely surrounded by the panel alignment marks (P_ALM1 and P_ALM2). The planar shape of the alignment holes P_ALH is not limited to that illustrated in FIG. 3, but may vary.

Referring to FIG. 4, a plurality of lead wires LE may be provided in the first circuit area CA1 and may be arranged along the first direction DR1. The lead wires LE may include a plurality of power lead wires (PW_LE1 and PW_LE2), a plurality of data lead wires (D_LE1 and D_LE2), and a plurality of dummy leads DU_LE. The power lead wires (PW_LE1 and PW_LE2) may electrically connect the driver IC 390 and the power pads (PW_PAD1 and PW_PAD2), and the data lead wires (D_LE1 and D_LE2) may electrically connect the driver IC 390 and the data pads (D_PAD1 and D_PAD2). The dummy leads DU_LE may be electrically isolated from the driver IC 390.

The array of the dummy leads DU_LE may be disposed between the array of first data lead wires D_LE1 and the array of second data lead wires D_LE2, the array of the first data lead wires D_LE1 may be disposed between the array of first power lead wires PW_LE1 and the array of the dummy leads DU_LE, and the array of second data lead wires D_LE2 may be disposed between the array of second power lead wires PW_LE2 and the array of the dummy leads DU_LE.

The lead wires LE may include a metal material. In an exemplary embodiment, the lead wires LE may include at least one metal selected from among Mo, Al, Pt, palladium (Pd), Ag, Mg, Au, Ni, Nd, Ir, Cr, Ca, Ti, Ta, W, and Cu, for example.

Lead alignment marks (L_ALM1 and L_ALM2) may be disposed on both sides of the array of the lead wires LE. That is, a second lead alignment mark L_ALM2 may be disposed on a first side, in the first direction DR1, of the array of the lead wires LE, and a first lead alignment mark L_ALM1 may be disposed on a second side, in the first direction DR1, of the array of the lead wires LE.

Alignment holes L_ALH may be defined in the lead alignment marks (L_ALM1 and L_ALM2). In a plan view, the alignment holes L_ALH may be completely surrounded by the lead alignment marks (L_ALM1 and L_ALM2). FIG. 4 illustrates that the alignment holes L_ALH are vertically symmetrical with the panel alignment marks (P_ALM1 and P_ALM2), but the invention is not limited thereto.

The wire pads PAD and the panel alignment marks (P_ALM1 and P_ALM2) may be surface-bonded to the lead wires LE and the lead alignment marks (L_LM1 and L_LM2), respectively, through ultrasonic bonding. The first circuit area CA1 of FIG. 4 is inverted by 180 degrees (°) and is then attached to the panel pad area P_PA of FIG. 3 in the thickness direction. That is, the power pads (PW_PAD1 and PW_PAD2) may be ultrasonic-bonded to the power lead wires (PW_LE1 and PW_LE2), the data pads (D_PAD1 and D_PAD2) may be ultrasonic-bonded to the data lead wires (D_LE1 and D_LE2), the panel dummy pads DU_PAD may be ultrasonic-bonded to the dummy leads DU_LE, and the panel alignment marks (P_ALM1 and P_ALM2) may be ultrasonic-bonded to the lead alignment marks (L_LM1 and L_LM2). As already mentioned above, holes P_ALH or L_ALM are defined in the panel alignment marks (P_ALM1 and P_ALM2) and the lead alignment marks (L_ALM1 and L_ALM2). Accordingly, during ultrasonic bonding, the panel alignment marks (P_ALM1 and P_ALM2) and the lead alignment marks (L_ALM1 and L_ALM2) may increase the contact area therebetween and may thus enhance the bonding force therebetween.

Exemplary plan views and cross-sectional views of the display device 1 including the wire pads PAD and the panel alignment marks (P_ALM1 and P_ALM2) ultrasonic-bonded to the lead wires LE and the lead alignment marks (L_LM1 and L_LM2), respectively, will hereinafter be described. Alignment error may occur in the process of aligning the wire pads PAD and the panel alignment marks (P_ALM1 and P_ALM2) with the lead wires LE and the lead alignment marks (L_LM1 and L_LM2), respectively, to ultrasonic-bond the wire pads PAD and the panel alignment marks (P_ALM1 and P_ALM2) to the lead wires LE and the lead alignment marks (L_LM1 and L_LM2), respectively.

Figure 5:
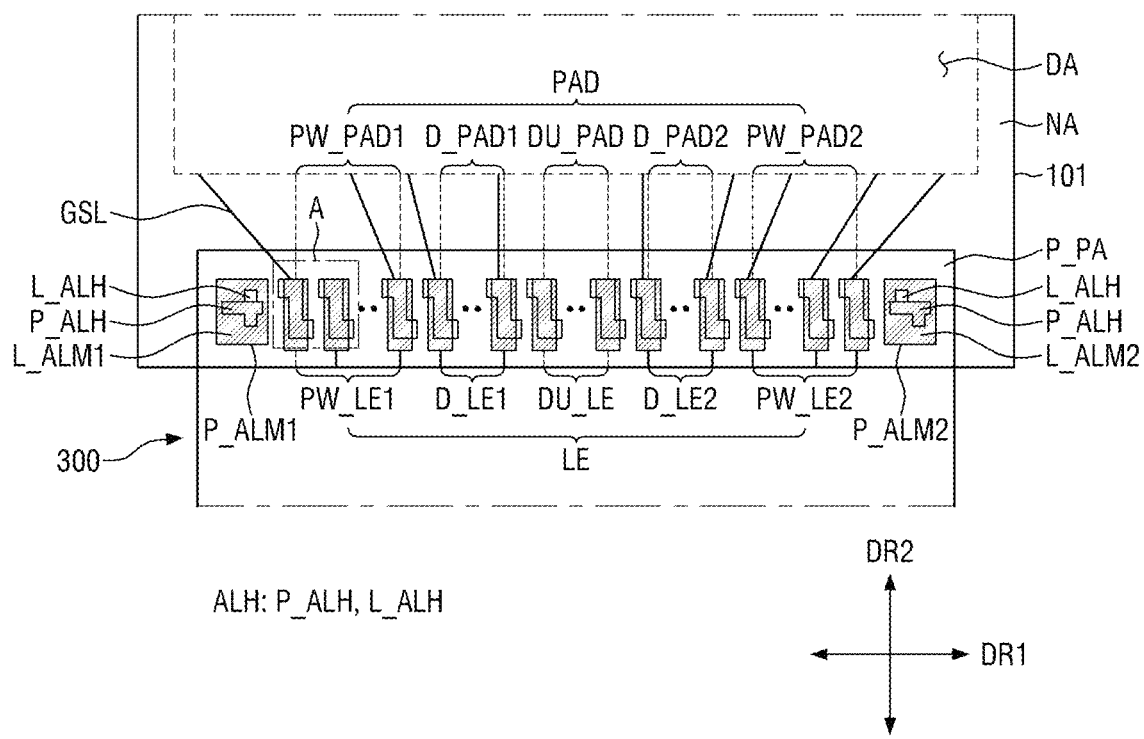
FIG. 5 is a partial plan view illustrating a case where the pad area of FIG. 3 and the PCB of FIG. 4 are attached to, and properly aligned with, each other with no misalignment therebetween, i.e., α=0% (where a denotes alignment error)
Figure 6:
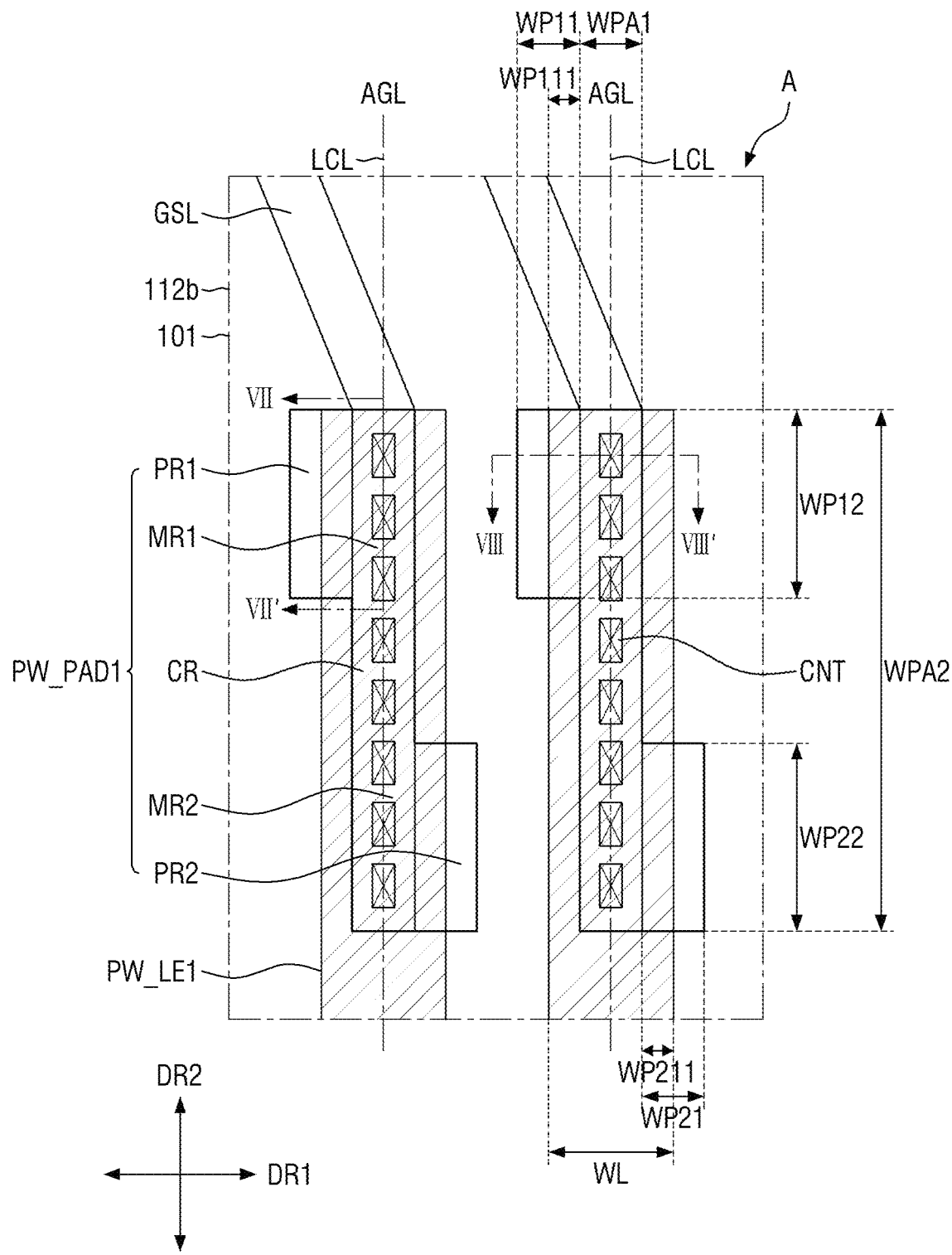
FIG. 6 is an enlarged plan view illustrating an area A of FIG. 5.
Figure 7:
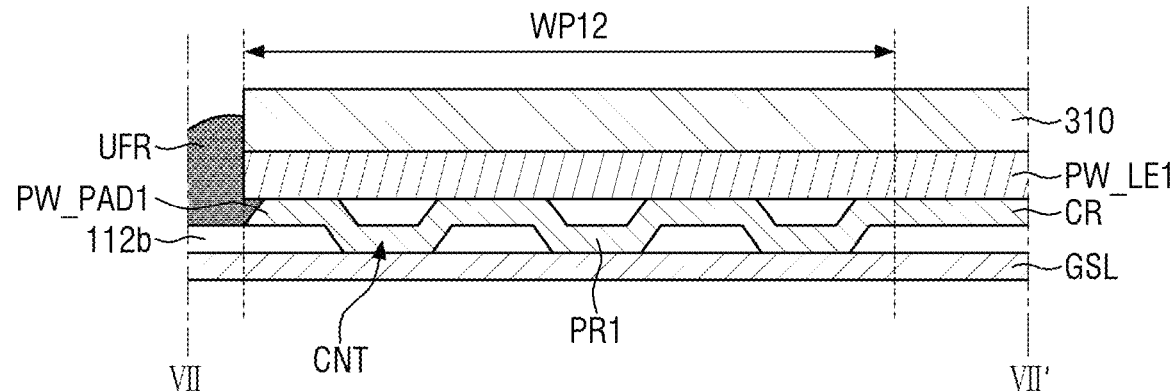
FIG. 7 is a cross-sectional view taken along line VII-VII' of FIG. 6.
Figure 8:
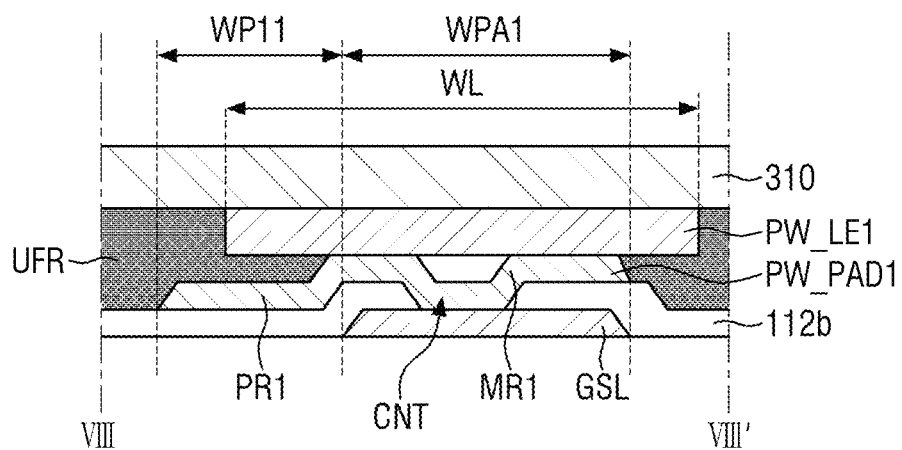
FIG. 8 is a cross-sectional view taken along line VIII-VIII' of FIG. 6.

FIG. 5 is a partial plan view illustrating a case where the pad area of FIG. 3 and the PCB of FIG. 4 are attached to, and properly aligned with, each other with no misalignment therebetween, i.e., $\alpha=0\%$ (where $\alpha$ denotes alignment error), FIG. 6 is an enlarged plan view illustrating an area A of FIG. 5, FIG. 7 is a cross-sectional view taken along line VII-VII' of FIG. 6, and FIG. 8 is a cross-sectional view taken along line VIII-VIII' of FIG. 6.

Referring to FIGS. 5 through 8, as already mentioned above, each of the wire pads PAD protrude in two different directions. The planar shape and the cross-sectional structure of the wire pads PAD will hereinafter be described, taking one first power pad PW_PAD1 as an example, and the description of the first power pad PW_PAD1 that follows may directly apply to the other first power pads PW_PAD1, the second power pads PW_PAD2, the data pads (D_PAD1 and D_PAD2), and the panel dummy pads DU_PAD.

The first power pad PW_PAD1 may include main pad portions (MR1 and MR2) which overlap with a gate signal wire GSL. The main pad portions (MR1 and MR2) may extend along the second direction DR2. First and second main pad portions MR1 and MR2 may be spaced apart from each other in the second direction DR2 and may overlap with each other in the second direction DR2 in a plan view. The first main pad portion MR1 may be located closer than the second main pad portion MR2 to the display area DA. The main pad portions (MR1 and MR2) may be electrically connected to the gate signal wire GSL through the contact holes CNT of the second insulating layer 112b. The arrangement and the number of contact holes CNT of the second insulating layer 112b may vary. The main pad portions (MR1 and MR2) may have a rectangular shape in a plan view.

A pad connecting portion CR may be disposed between the first and second main pad portions MR1 and MR2 to physically connect the first and second main pad portions MR1 and MR2.

The main pad portions (MR1 and MR2) and the pad connecting portion CR of the first power pad PW_PAD1 may have a width WPA1 in the first direction DR1 and a width WPA in the second direction DR2, and the sum of the areas of the main pad portions (MR1 and MR2) and the pad connecting portion CR of the first power pad PW_PAD1 may be WPA1*WPA2.

A first protruding pad portion PR1 is disposed on a first side, in the first direction DR1, of the first main pad portion MR1, and a second protruding pad portion PR2 is disposed on a second side, in the first direction DR1, of the second main pad portion MR2. The first protruding pad portion PR1 may be located closer than the second protruding pad portion PR2 to the display area DA. FIG. 6 illustrates that the protruding pad portions (PR1 and PR2) do not overlap with the gate signal wire GSL in the thickness direction, but the invention is not limited thereto. That is, the protruding pad portions (PR1 and PR2) may overlap with the gate signal wire GSL in the thickness direction.

The pad connecting portion CR may include a first edge which is disposed adjacent to the first protruding pad portion PR1 and a second edge which is disposed adjacent to the second protruding pad portion PR2. The first and second edges of the pad connecting portion CR may both extend in the second direction DR2. The first edge of the pad connecting portion CR may be the boundary between the first main pad portion MR1 and the first protruding pad portion PR1, and the second edge of the pad connecting portion CR may be the boundary between the second main pad portion MR2 and the second protruding pad portion PR2. That is, the protruding pad portions (PR1 and PR2) may be parts of the pad connecting portion CR that extend from the first and second edges of the pad connecting portion CR in the first direction DR1 and may be physically connected to the main pad portions (MR1 and MR2) through the first and second edges of the pad connecting portion CR.

The first and second protruding pad portions PR1 and PR2 may have the same area in a plan view. Also, the first and second protruding pad portions PR1 and PR2 may have the same shape in a plan view. The first and second protruding pad portions PR1 and PR2 may have a rectangular or square shape in a plan view. In an exemplary embodiment, the first protruding pad portion PR1 may have a width WP11 in the first direction DR1 and a width WP12 in the second direction DR2, and the second protruding pad portion PR2 may have a width WP21 in the first direction DR1 and a width WP22 in the second direction DR2, for example. The first and second protruding pad portions PR1 and PR2 may have the same width and the same area in a plan view. That is, the area of each of the protruding pad portions (PR1 and PR2) may be WP11*WP12. Also, the width, in the first direction DR1, of the protruding pad portions (PR1 and PR2) may be the same as the width, in the first direction DR1, of the main pad portions (MR1 and MR2), but the invention is not limited thereto.

A first power lead wire PW_LE1 may have a linear shape extending in the second direction DR2, as illustrated in FIG. 6. In this case, the width, in the first direction DR1, of the first power lead wire PW_LE1 may be WL.

The first power lead wire PW_LE1 is bonded onto the first power pad PW_PAD1. The first power lead wire PW_LE1 may be bonded to the first power pad PW_PAD1 with a lead center line LCL thereof aligned with an alignment line AGL. The alignment line AGL is the center line, in the first direction DR1, of the first power pad PW_PAD1, and the lead center line LCL may be the center line, in the first direction DR1, of the first power lead wire PW_LE1.

As already mentioned above, misalignment with an alignment error α may occur in the process of aligning the first power lead wire PW_LE1 with the first power pad PW_PAD1. The alignment error α satisfies the following equation:

$$\text{Alignment Error } \alpha(\%) = \frac{L}{WL1} = \frac{\pm D}{WL1}$$

where L denotes alignment error displacement and D denotes the distance between the alignment line AGL and the lead center line LCL.

When the first power lead wire PW_LE1 is properly aligned with the first power pad PW_PAD1, the distance D and the alignment error displacement L are both zero. When the first power lead wire PW_LE1 is misaligned by being moved to a first side thereof in the first direction DR1, L=−D (where D>0). When the first power lead wire PW_LE1 is misaligned by being moved to a second side thereof in the first direction DR1, L=+D (where D>0).

Referring to FIGS. 5 through 8, the first power lead wire PW_LE1 may completely overlap with the main pad portions (MR1 and MR2) and the pad connecting portion CR of the first power pad PW_PAD1 in the thickness direction and may partially overlap with the protruding pad portions (PR1 and PR2) of the first power pad PW_PAD1 in the thickness direction. Referring to FIG. 6, the width, in the first direction DR1, of the overlapping area of the first protruding pad portion PR1 and the first power lead wire PW_LE1 and the width, in the first direction DR1, of the overlapping area of the second protruding pad portion PR2 and the first power lead wire PW_LE1 may be WP111 and WP221, respectively, and the width, in the second direction DR2, of the overlapping area of the first protruding pad portion PR1 and the first power lead wire PW_LE1 and the width, in the second direction DR2, of the overlapping area of the second protruding pad portion PR2 and the first power lead wire PW_LE1 may be WP12 and WP22, respectively. When the first power lead wire PW_LE1 and the first power pad PW_PAD1 are properly aligned, the widths WP111 and WP221 may be the same.

As illustrated in FIGS. 7 and 8, the first power lead wire PW_LE1 may be in a surface contact with protruding parts of the surface of the first power pad PW_PAD1 and may be spaced apart from recessed parts of the surface of the first power pad PW_PAD1. In an alternative exemplary embodiment, the first power lead wire PW_LE1 may also be in a partial surface contact with the recessed parts of the surface of the first power pad PW_PAD1. In an area where the first power lead wire PW_LE1 and the first power pad PW_PAD1 are in a surface contact with each other, the first power lead wire PW_LE1 and the first power pad PW_PAD1 may be surface-bonded to each other.

The size of an area where the first power pad PW_PAD1 may be surface-bonded to the first power lead wire PW_LE1 may be proportional to the size of an area where the first power pad PW_PAD1 and the first power lead wire PW_LE1 overlap with each other in the thickness direction. Specifically, the overlapping area, in the thickness direction, of the first power pad PW_PAD1 and the first power lead wire PW_LE1 may be the sum of the overlapping area of the first power lead wire PW_LE1 and the main pad portions (MR1 and MR2) and the pad connecting portion CR of the first power pad PW_PAD1 and the sum of the overlapping areas of the first power lead wire PW_LE1 and the protruding pad portions (PR1 and PR2) of the first power pad PW_PAD1, i.e., WPA1*WPA2+2*WP111*WP12. That is, when the first power lead wire PW_LE1 and the first power pad PW_PAD1 are properly aligned, the size of the area where the first power lead wire PW_LE1 and the first power pad PW_PAD1 may be surface-bonded together may be WPA1*WPA2+2*WP111*WP12.

Figure 9:
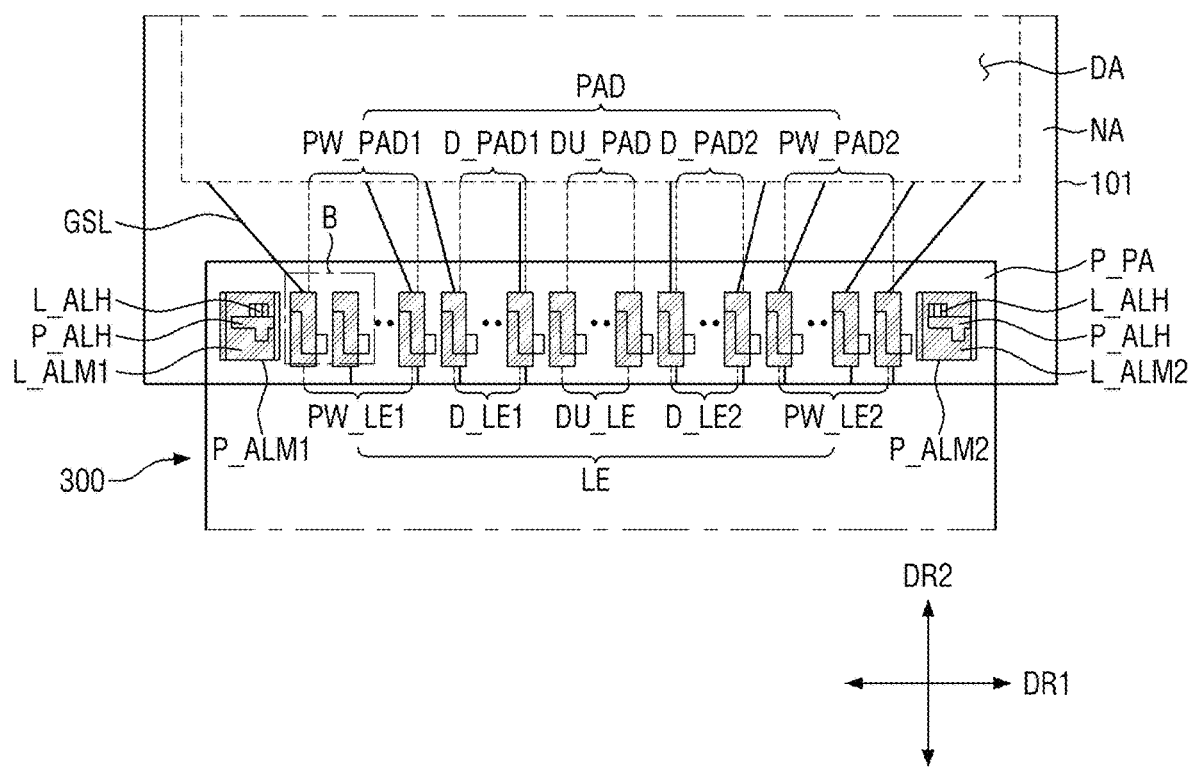
FIG. 9 is a plan view illustrating a case where the pad area of FIG. 3 and the PCB of FIG. 4 are attached to, but misaligned with, each other, i.e., α<0.
Figure 10:
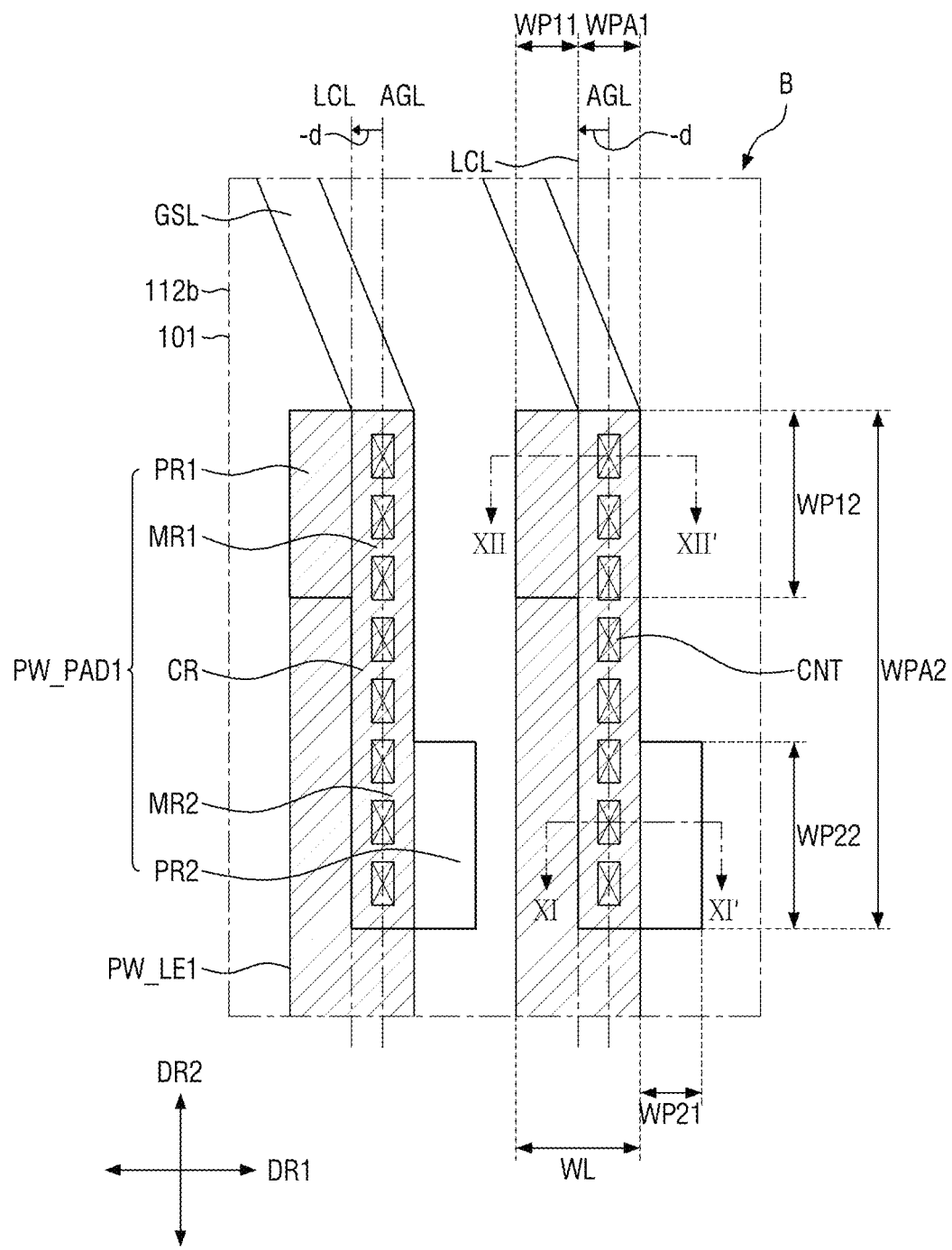
FIG. 10 is an enlarged plan view illustrating an area B of FIG. 9.
Figure 11:
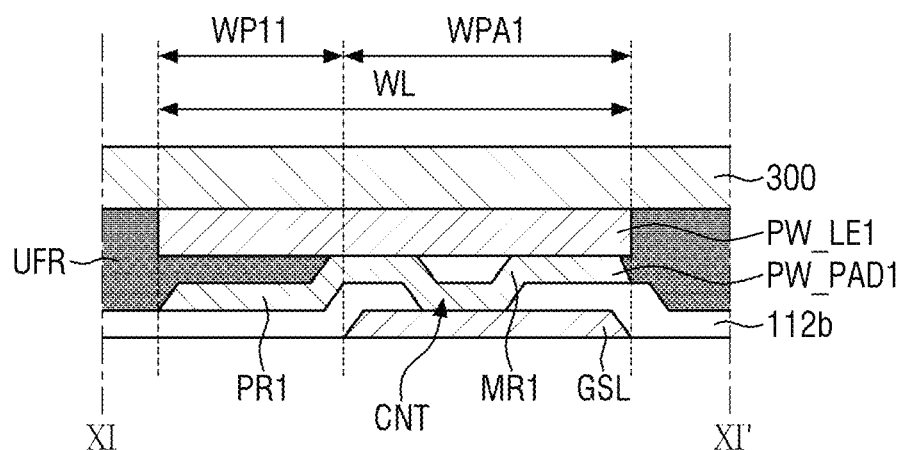
FIG. 11 is a cross-sectional view taken along line XI-XI' of FIG. 10.
Figure 12:
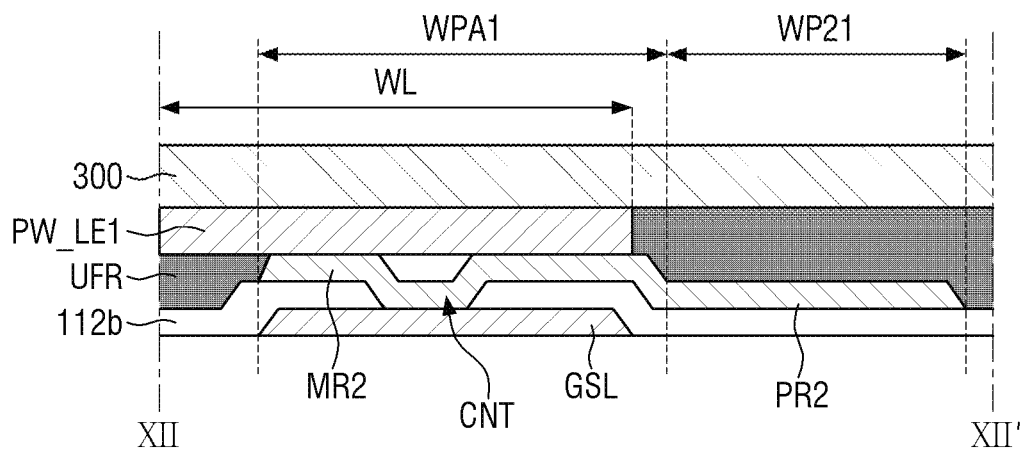
FIG. 12 is a cross-sectional view taken along line XII-XII' of FIG. 10.

FIG. 9 is a plan view illustrating a case where the pad area of FIG. 3 and the PCB of FIG. 4 are attached to, but misaligned with, each other, i.e., α<0, FIG. 10 is an enlarged plan view illustrating an area B of FIG. 9, FIG. 11 is a cross-sectional view taken along line XI-XI' of FIG. 10, and FIG. 12 is a cross-sectional view taken along line XII-XII' of FIG. 10.

Referring to FIGS. 9 through 12, when aligning the first power lead wire PW_LE1 with the first power pad PW_PAD1, the overlapping area, in the thickness direction, of the first power lead wire PW_LE1 and the first power pad PW_PAD1 may be uniformly maintained on condition that a first edge, in the first direction DR1, of the first power lead wire PW_LE1 is disposed in an area that overlaps with the first protruding pad portion PR1 of the first power pad PW_PAD1 and a second edge, in the first direction DR1, of the first power lead wire PW_LE1 is disposed in an area that overlaps with the second protruding pad portion PR2 of the first power pad PW_PAD1.

Specifically, when the lead center line LCL of the first power lead wire PW_LE1 is misaligned with the alignment line AGL toward a first side, in the first direction DR1, of the alignment line AGL, but only to the extent that the first edge, in the first direction DR1, of the first power lead wire PW_LE1 falls in the area that overlaps with the first protruding pad portion PR1 of the first power pad PW_PAD1 and the second edge, in the first direction DR1, of the first power lead wire PW_LE1 falls in the area that overlaps with the second protruding pad portion PR2, the overlapping area, in the thickness direction, of the first power lead wire PW_LE1 and the first main pad portion MR1, the second main pad portion MR2, and the pad connecting portion CR of the first power pad PW_PAD1 is maintained, the overlapping area, in the thickness direction, of the first power lead wire PW_LE1 and the first protruding pad portion PR1 of the first power pad PW_PAD1 is increased, and the overlapping area, in the thickness direction, of the first power lead wire PW_LE1 and the second protruding pad portion PR2 of the first power pad PW_PAD1 is reduced, as compared to when the first power lead wire PW_LE1 and the first power pad PW_PAD1 are properly aligned. In an exemplary embodiment, when the lead center line LCL of the first power lead wire PW_LE1 is misaligned by being moved away from the alignment line AGL by as much as −D, the overlapping area, in the thickness direction, of the first protruding pad portion PR1 and the first power lead wire PW_LE1 may be (WP111+D)*WP12, and the overlapping area, in the thickness direction, of the second protruding pad portion PR2 and the first power lead wire PW_LE1 may be (WP221−D)*WP22, for example. As already mentioned above, the width, in the second direction DR2, of the first protruding pad portion PR1, i.e., WP12, and the width, in the second direction DR2, of the second protruding pad portion PR2, i.e., WP22, are the same and when WP111 and WP221 are the same, the sum of the overlapping area, in the thickness direction, of the first power lead wire PW_LE1 and the first protruding pad portion PR1 and the overlapping area, in the thickness direction, of the first power lead wire PW_LE1 and the second protruding pad portion PR2 may be 2*WP111*WP12.

That is, even when the lead center line LCL of the first power lead wire PW_LE1 is misaligned with the alignment line AGL, but when the first edge, in the first direction DR1, of the first power lead wire PW_LE1 falls in the area that overlaps with the first protruding pad portion PR1 of the first power pad PW_PAD1 and the second edge, in the first direction DR1, of the first power lead wire PW_LE1 falls in the area that overlaps with the second protruding pad portion PR2, the size of an area where the first power lead wire PW_LE1 and the first power pad PW_PAD1 may be surface-bonded together may be maintained to be WPA1*WPA2+2*WP111*WP12, which is the same as when the first power lead wire PW_LE1 and the first power pad PW_PAD1 are properly aligned.

Figure 13:
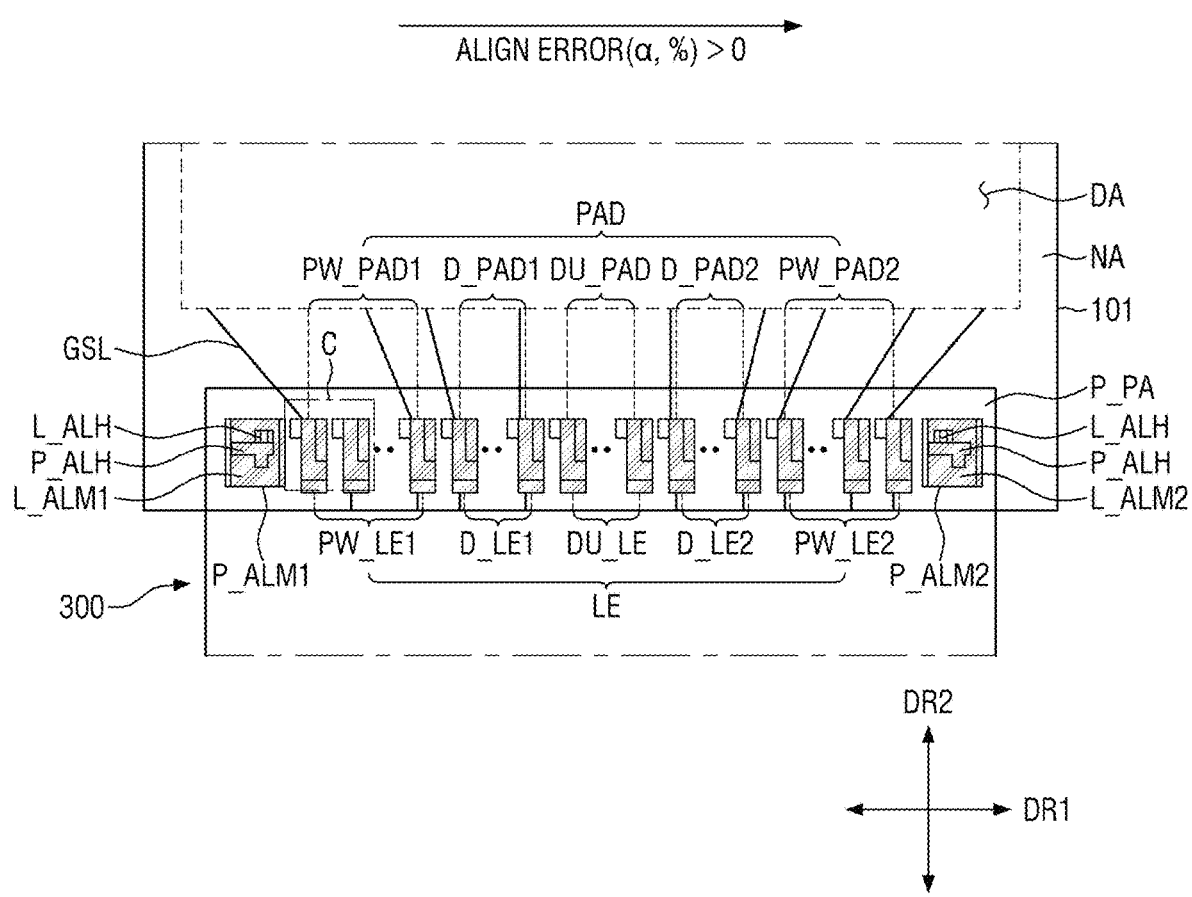
FIG. 13 is a plan view illustrating a case where the pad area of FIG. 3 and the PCB of FIG. 4 are attached to, but misaligned with, each other, i.e., =>0.
Figure 14:
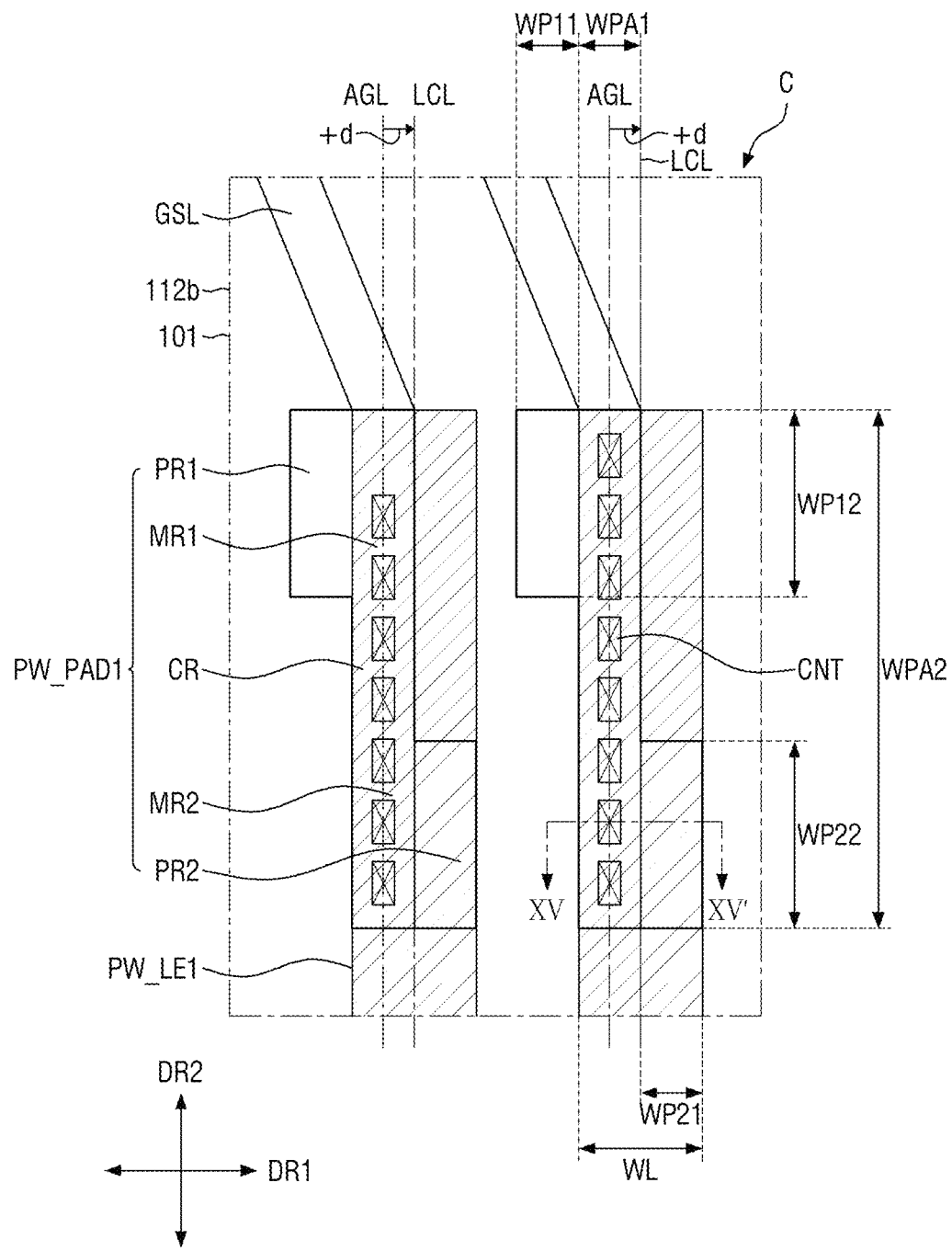
FIG. 14 is an enlarged plan view illustrating an area C of FIG. 13.
Figure 15:
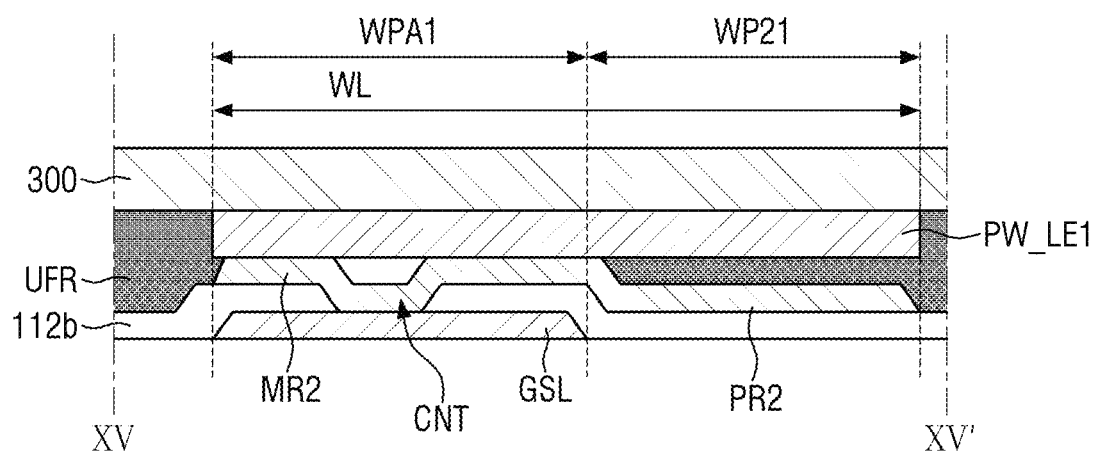
FIG. 15 is a cross-sectional view taken along line XV-XV' of FIG. 14.

FIG. 13 is a plan view illustrating a case where the pad area of FIG. 3 and the PCB of FIG. 4 are attached to, but misaligned with, each other, i.e., α>0, FIG. 14 is an enlarged plan view illustrating an area C of FIG. 13, and FIG. 15 is a cross-sectional view taken along line XV-XV' of FIG. 14.

Referring to FIGS. 13 through 15, even when the first power lead wire PW_LE1 is misaligned with the first power pad PW_PAD1 in a direction opposite to that in the example of FIGS. 9 through 12, the overlapping area of the first power lead wire PW_LE1 and the first power pad PW_PAD1 may be uniformly maintained on condition that the first edge, in the first direction DR1, of the first power lead wire PW_LE1 falls in the area that overlaps with the first protruding pad portion PR1 of the first power pad PW_PAD1 and the second edge, in the first direction DR1, of the first power lead wire PW_LE1 falls in the area that overlaps with the second protruding pad portion PR2.

Specifically, when the lead center line LCL of the first power lead wire PW_LE1 is misaligned with the alignment line AGL toward a second side, in the first direction DR1, of the alignment line AGL, but only to the extent that the first edge, in the first direction DR1, of the first power lead wire PW_LE1 falls in the area that overlaps with the first protruding pad portion PR1 of the first power pad PW_PAD1 and the second edge, in the first direction DR1, of the first power lead wire PW_LE1 falls in the area that overlaps with the second protruding pad portion PR2, the overlapping area, in the thickness direction, of the first power lead wire PW_LE1 and the first main pad portion MR1, the second main pad portion MR2, and the pad connecting portion CR of the first power pad PW_PAD1 is maintained, the overlapping area, in the thickness direction, of the first power lead wire PW_LE1 and the first protruding pad portion PR1 of the first power pad PW_PAD1 is reduced, and the overlapping area, in the thickness direction, of the first power lead wire PW_LE1 and the second protruding pad portion PR2 of the first power pad PW_PAD1 is increased, as compared to when the first power lead wire PW_LE1 and the first power pad PW_PAD1 are properly aligned. In an exemplary embodiment, when the lead center line LCL of the first power lead wire PW_LE1 is misaligned by being moved away from the alignment line AGL by as much as +D, the overlapping area, in the thickness direction, of the first protruding pad portion PR1 and the first power lead wire PW_LE1 may be (WP111−D)*WP12, and the overlapping area, in the thickness direction, of the second protruding pad portion PR2 and the first power lead wire PW_LE1 may be (WP221+D)*WP22, for example. As already mentioned above, when the width, in the second direction DR2, of the first protruding pad portion PR1, i.e., WP12, and the width, in the second direction DR2, of the second protruding pad portion PR2, i.e., WP22, are the same and when WP111 and WP221 are the same, the sum of the overlapping area, in the thickness direction, of the first power lead wire PW_LE1 and the first protruding pad portion PR1 and the overlapping area, in the thickness direction, of the first power lead wire PW_LE1 and the second protruding pad portion PR2 may be 2*WP111*WP12, which is the same as when the first power lead wire PW_LE1 and the first power pad PW_PAD1 are properly aligned and when the first power lead wire PW_LE1 is misaligned with the first power pad PW_PAD1 toward the first side, in the first direction DR1, of the alignment line AGL.

If the degree of misalignment between the lead wires LE and the wire pads PAD varies in an ultrasonic bonding process for bonding the wire pads PAD and the lead wires LE during the manufacture of the display device 1, the bonding area between the lead wires LE and the wire pads PAD may undesirably vary, and as a result, bonding defects and resistance irregularities may occur. However, since each of the wire pads PAD protrudes in two different directions and includes protruding pad portions (PR1 and PR2) having the same area and the same shape, the overlapping areas, in the thickness direction, of the lead wires LE and the wire pads may be uniformly maintained even when misalignment occurs. That is, the size of areas where the lead wires LE and the wire pads PAD may be surface-bonded together may be uniformly maintained. Therefore, bonding defects and resistance irregularities that may occur between the wire pads PAD and the lead wires LE may be prevented, or at least alleviated.

Display devices according to other exemplary embodiments of the invention will hereinafter be described. Like reference numerals indicate like elements throughout the specification, and descriptions thereof will be omitted or at least simplified.

Figure 16A:
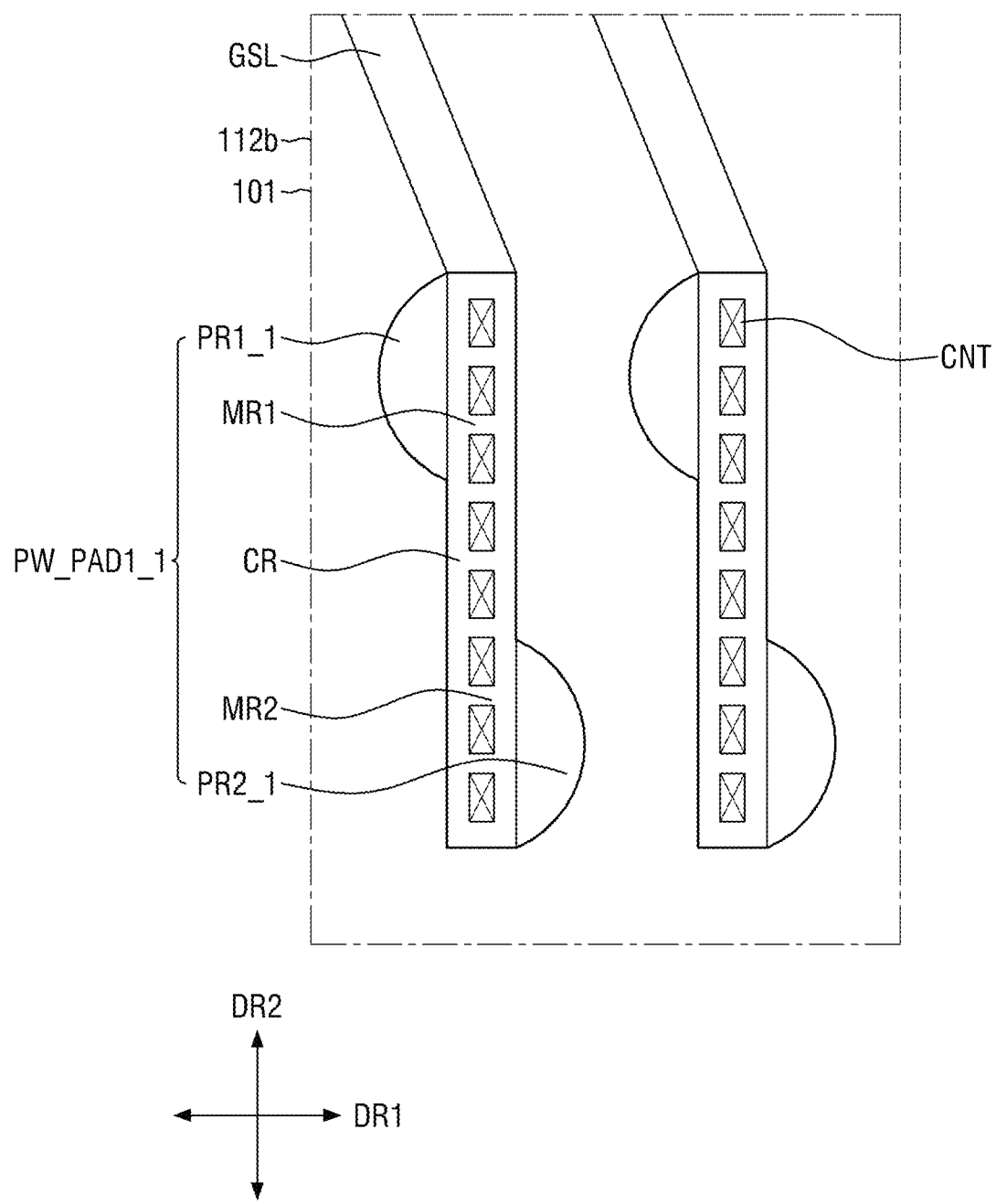
Figure 16C:
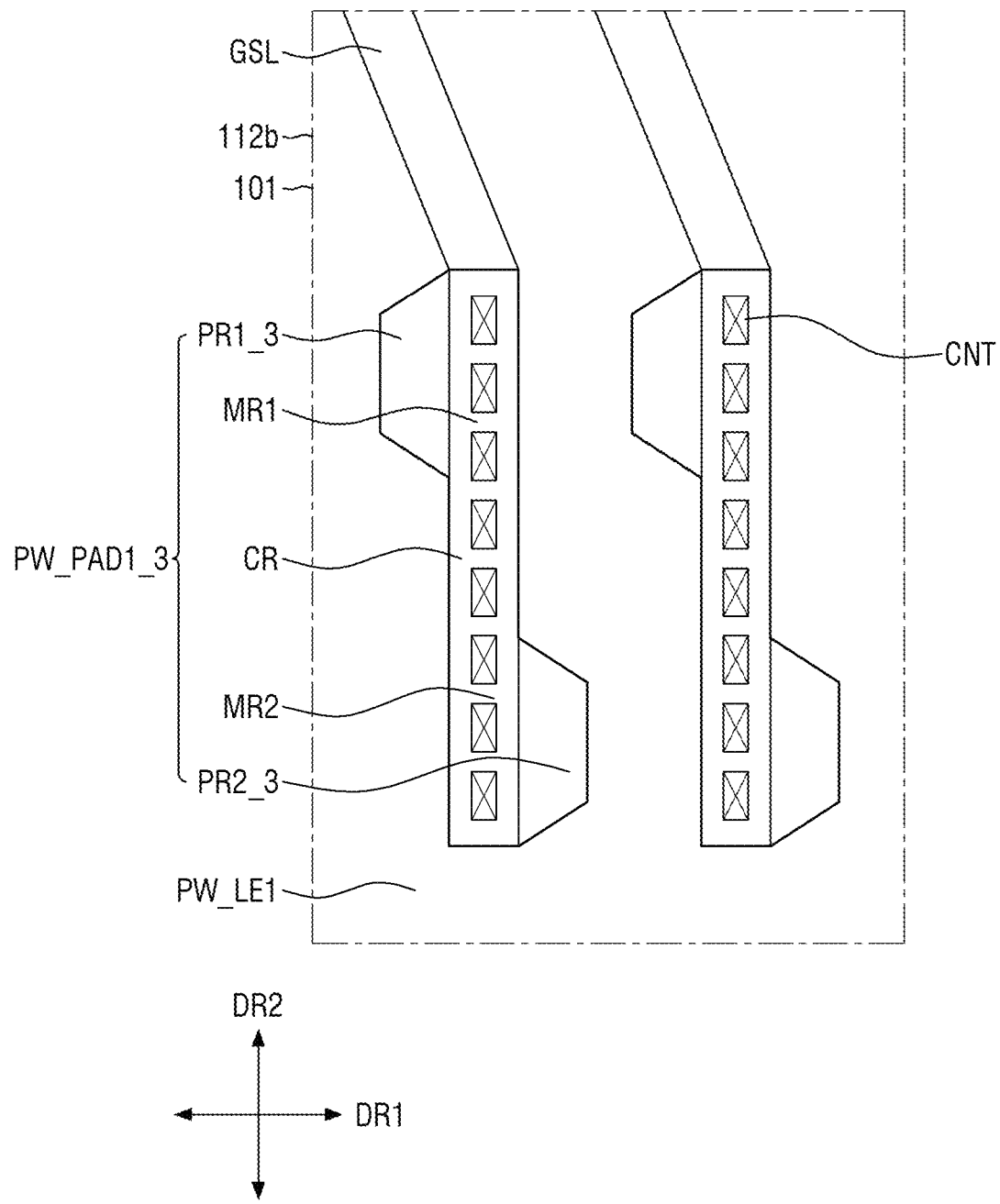

FIGS. 16A through 16C are enlarged plan views illustrating pad areas of display devices according to embodiments of the invention.

The pad areas of FIGS. 16A through 16C differ from its counterpart of FIG. 1 in that protruding pad portions are provided in a semicircular, triangular, or trapezoidal shape, respectively.

Specifically, referring to FIG. 16A, protruding pad portions (PR1_1 and PR2_1) may have a semicircular shape in a plan view. First protruding pad portions PR1_1 and second protruding pad portions PR2_1 may have the same area in a plan view and may have completely the same profile in a plan view.

Referring to FIG. 16B, protruding pad portions (PR1_2 and PR2_2) may have a triangular shape in a plan view. First protruding pad portions PR1_2 and second protruding pad portions PR2_2 may have the same area in a plan view and may have completely the same profile in a plan view.

Referring to FIG. 16C, protruding pad portions (PR1_3 and PR2_3) may have a triangular shape in a plan view. First protruding pad portions PR1_3 and second protruding pad portions PR2_3 may have the same area in a plan view and may have completely the same profile in a plan view.

In the exemplary embodiments of FIGS. 16A through 16C, each first power pad PW_PAD1_1 has protruding pad portions protruding in different directions and having the same area and the same shape. Thus, even when misalignment occurs, the overlapping areas, in a thickness direction, of lead wires and panel pads may be uniformly maintained. That is, the size of areas where the lead wires and the panel pads may be surface-bonded together may be uniformly maintained. Therefore, bonding defects and resistance irregularities that may occur between the lead wires and the panel pads may be prevented, or at least alleviated.

Figure 17:
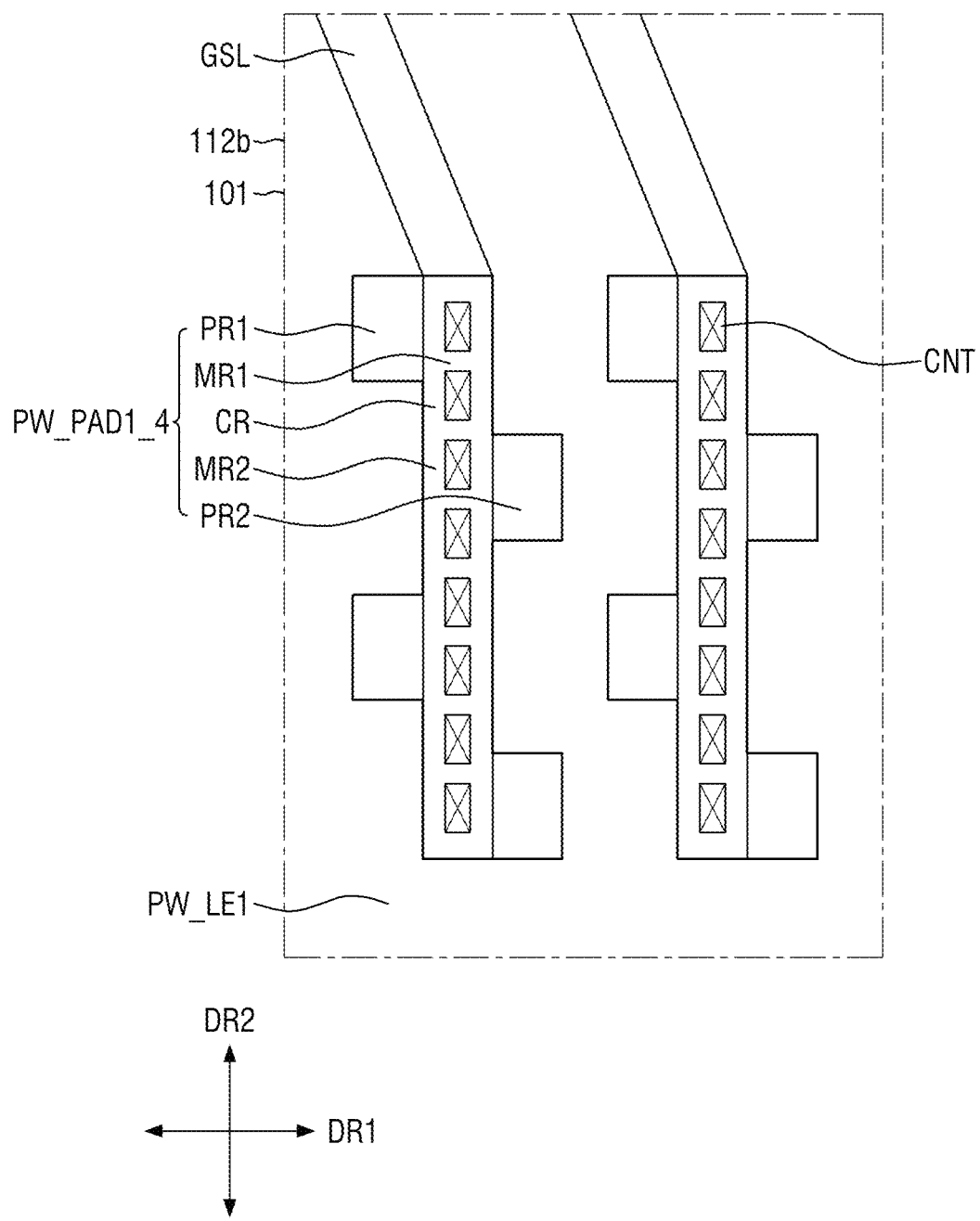
FIG. 17 is an enlarged plan view illustrating another exemplary embodiment of a pad area of a display device according to the invention.

FIG. 17 is an enlarged plan view illustrating another exemplary embodiment of a pad area of a display device according to the invention. First power pads PW_PAD1_4 of FIG. 17, unlike the first power pads PW_PAD1 of FIG. 3, have multiple first protruding pad portions PR1 and multiple second protruding pad portions PR2.

Specifically, referring to FIG. 17, each of the first power pads PW_PAD1_4 may include a plurality of first protruding pad portions PR1 and a plurality of second protruding pad portions PR2. The number of first protruding pad portions PR1 may be the same as the number of second protruding pad portions PR2. The second protruding pad portions PR2 may be arranged between the first protruding pad portions PR1 along a second direction DR2.

In the exemplary embodiments of FIG. 17, each first power pad PW_PAD1_1 has multiple protruding pad portions protruding in different directions and having the same area and the same shape. Thus, even when misalignment occurs, the overlapping areas, in a thickness direction, of lead wires and panel pads may be uniformly maintained. That is, the size of areas where the lead wires and the panel pads may be surface-bonded together may be uniformly maintained. Therefore, bonding defects and resistance irregularities that may occur between the lead wires and the panel pads may be prevented, or at least alleviated.

Figure 18:
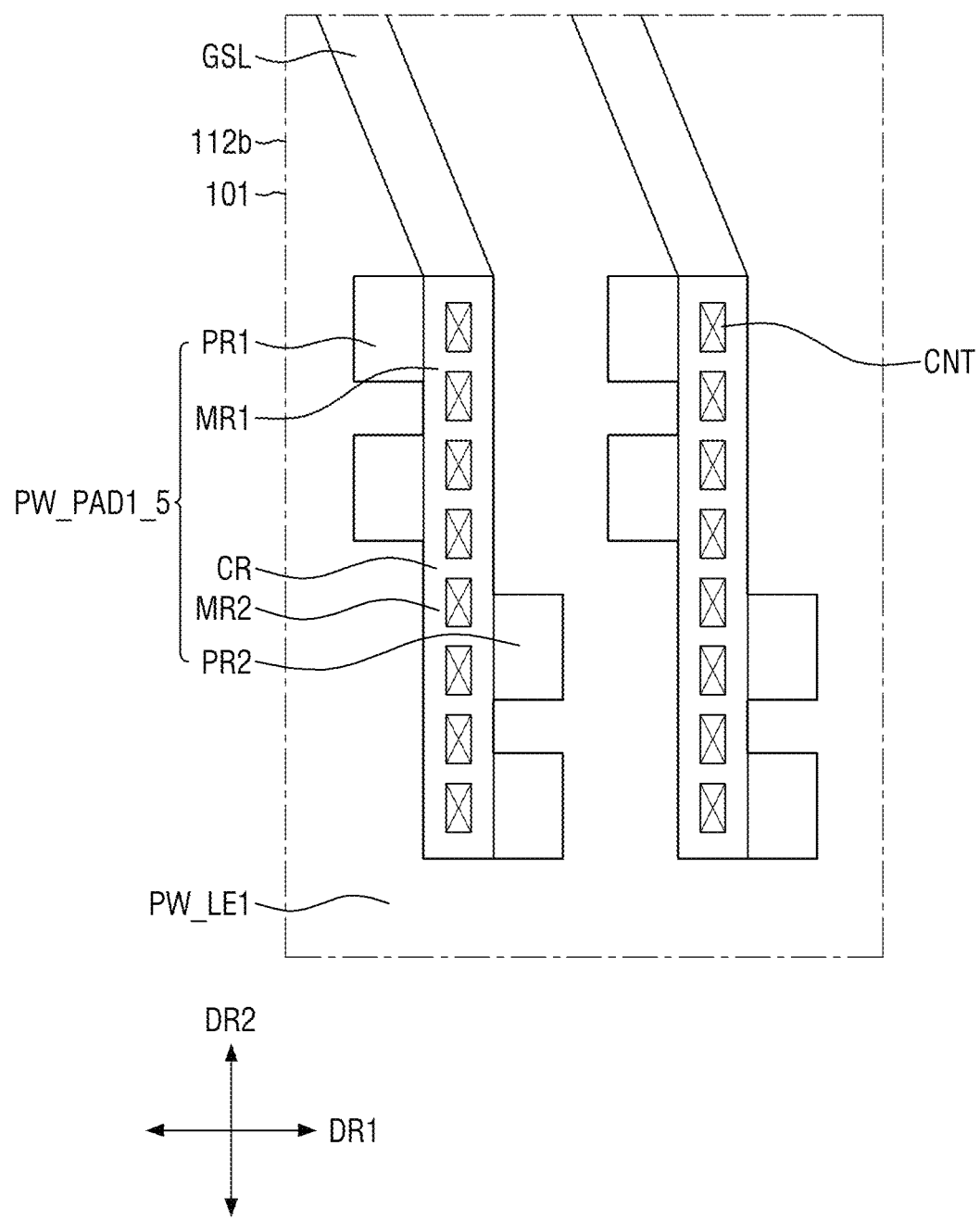
FIG. 18 is an enlarged plan view illustrating another exemplary embodiment of a pad area of a display device according to the invention.

FIG. 18 is an enlarged plan view illustrating another exemplary embodiment of a pad area of a display device according to the invention.

First power pads PW_PAD1_5 of FIG. 18 differ from the first power pads PW_PAD1_4 of FIG. 17 in that in each of the first power pads PW_PAD1_5, a first protruding pad portion PR1 is disposed between another first protruding pad portion PR1 and a second protruding pad portion PR2.

Figure 19:
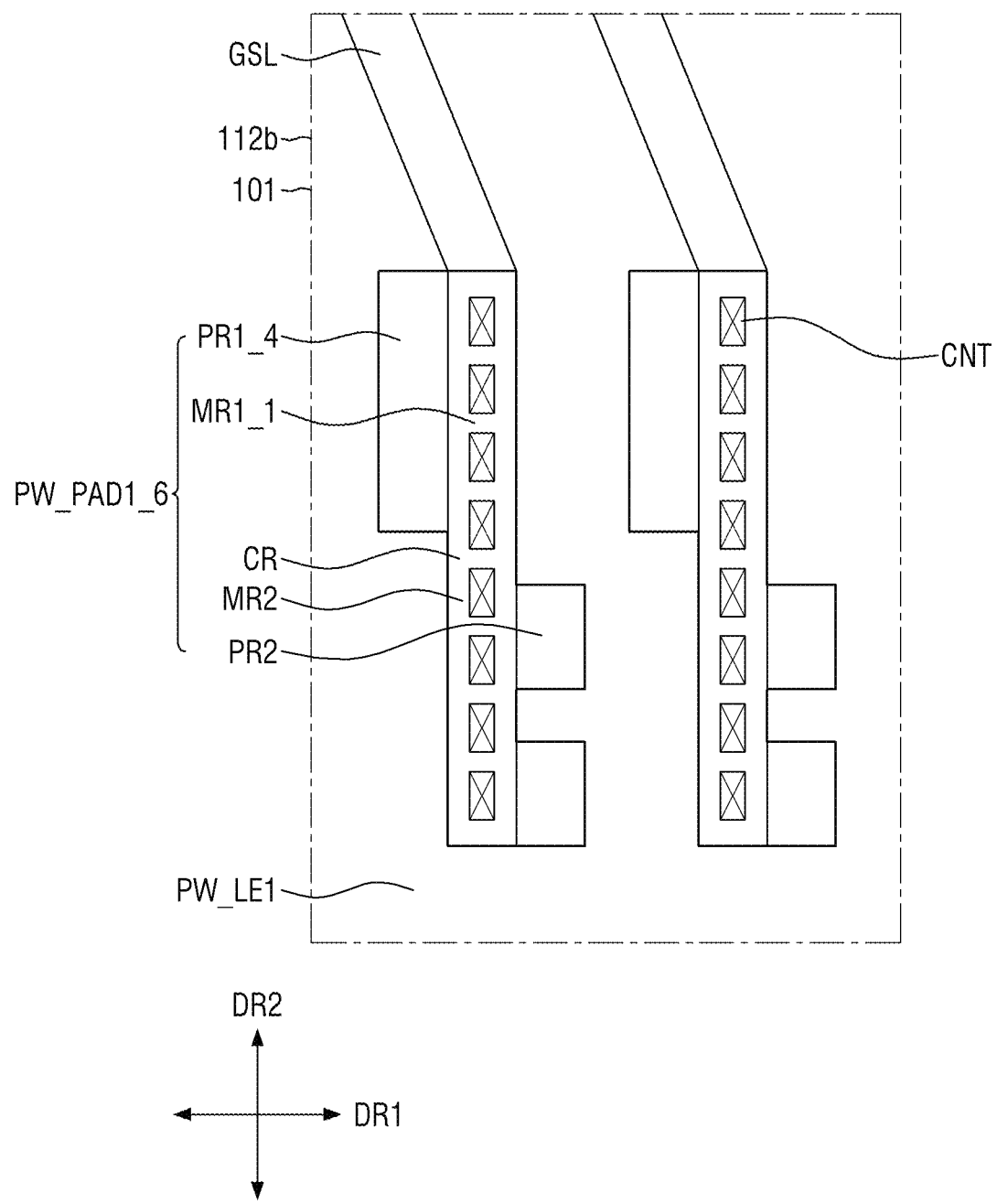
FIG. 19 is an enlarged plan view illustrating another exemplary embodiment of a pad area of a display device according to the invention.

FIG. 19 is an enlarged plan view illustrating another exemplary embodiment of a pad area of a display device according to the invention.

First power pads PW_PAD1_6 of FIG. 19 differ from the first power pads PW_PAD1_5 of FIG. 18 in that in each of the first power pads PW_PAD1_6, a first protruding pad portion PR1_4 has a different area from those of second protruding pad portions PR2 and a first main pad portion MR1_1 has a different area from that of a second main pad portion MR2.

Specifically, referring to FIG. 19, the number of second protruding pad portions PR2 provided in each of the first power pads PW_PAD1_6 is greater than the number of first protruding pad portions PR1_4 provided in each of the first power pads PW_PAD1_6, but the sum of the areas of the second protruding pad portions PR2 may be the same as the area of the first protruding pad portion PR1_4. That is, the width, in a first direction DR1, of the first protruding pad portion PR1_4 may be the same as the width, in the first direction DR1, of the second protruding pad portions PR2, and the width, in a second direction DR2, of the first protruding pad portion PR1_4 may be the same as the sum of the widths of the second protruding pad portions PR2.

In the exemplary embodiment of FIG. 19, even when misalignment occurs in the process of aligning lead wires with panel pads, the sum of the areas where the first protruding pad portion PR1_4 and the second protruding pad portions PR2 of each of the first power pads PW_PAD1_6 may be surface-bonded may be uniformly maintained. Therefore, bonding defects and resistance irregularities that may occur between the lead wires and the panel pads may be prevented, or at least alleviated.

Figure 20:
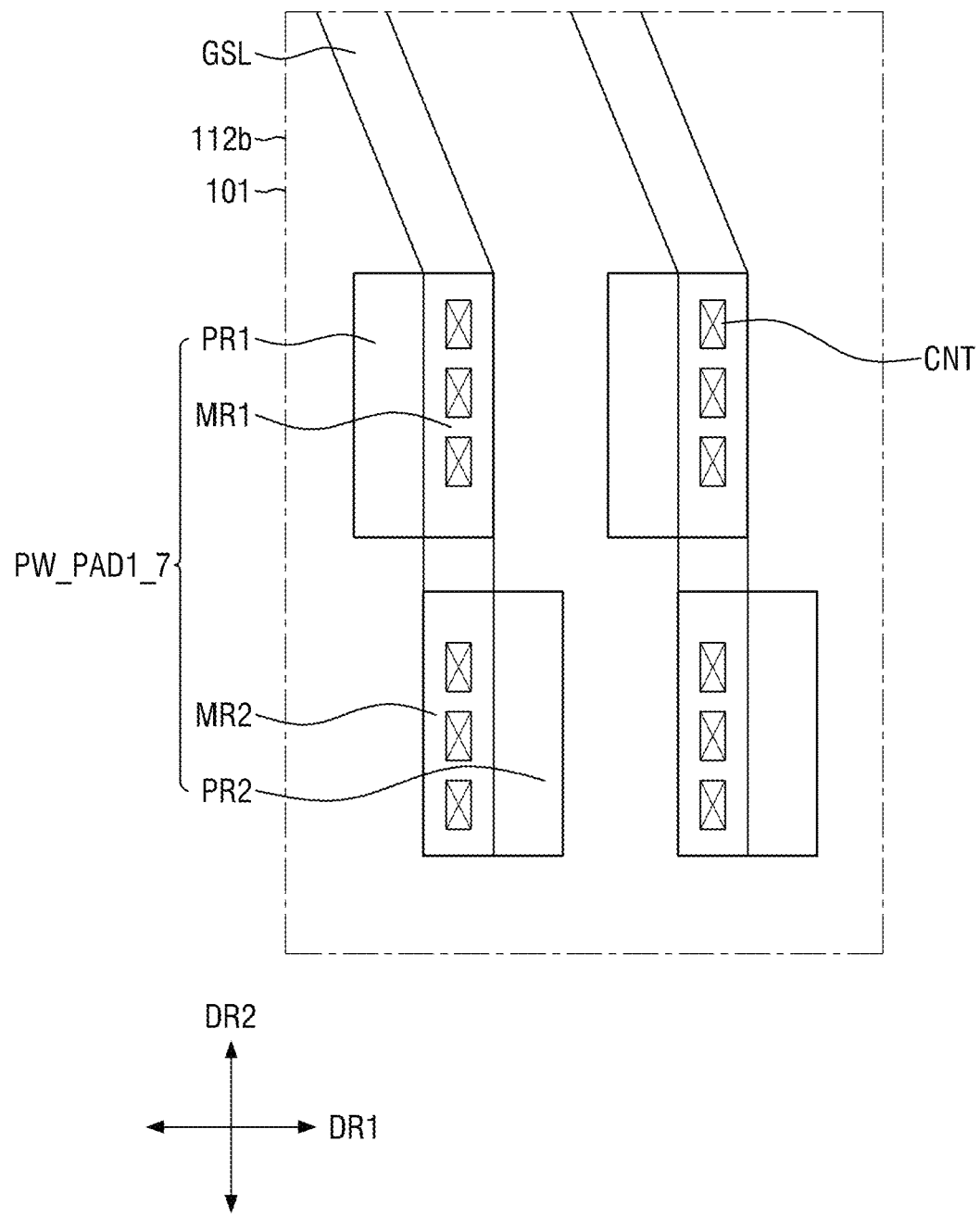
FIG. 20 is an enlarged plan view illustrating another exemplary embodiment of a pad area of a display device according to the invention.

FIG. 20 is an enlarged plan view illustrating another exemplary embodiment of a pad area of a display device according to the invention.

First power pads PW_PAD1_7 of FIG. 20 differ from the first power pads PW_PAD1 of FIG. 3 in that they do not include pad connecting portions.

Specifically, referring to FIG. 20, first and second main pad portions MR1 and MR2 of each of the first power pads PW_PAD1_7 may be spaced apart from each other in a second direction DR2. In the gap between the first and second main pad portions MR1 and MR2, a contact hole CNT may not be defined in a second insulating layer 112b.

In the exemplary embodiment of FIG. 20, even when misalignment occurs in the process of aligning lead wires with panel pads, the sum of the areas where first and second protruding pad portions PR1 and PR2 of each of the first power pads PW_PAD1_7 may be surface-bonded may be uniformly maintained. Therefore, bonding defects and resistance irregularities that may occur between the lead wires and the panel pads may be prevented, or at least alleviated.

Figure 21:
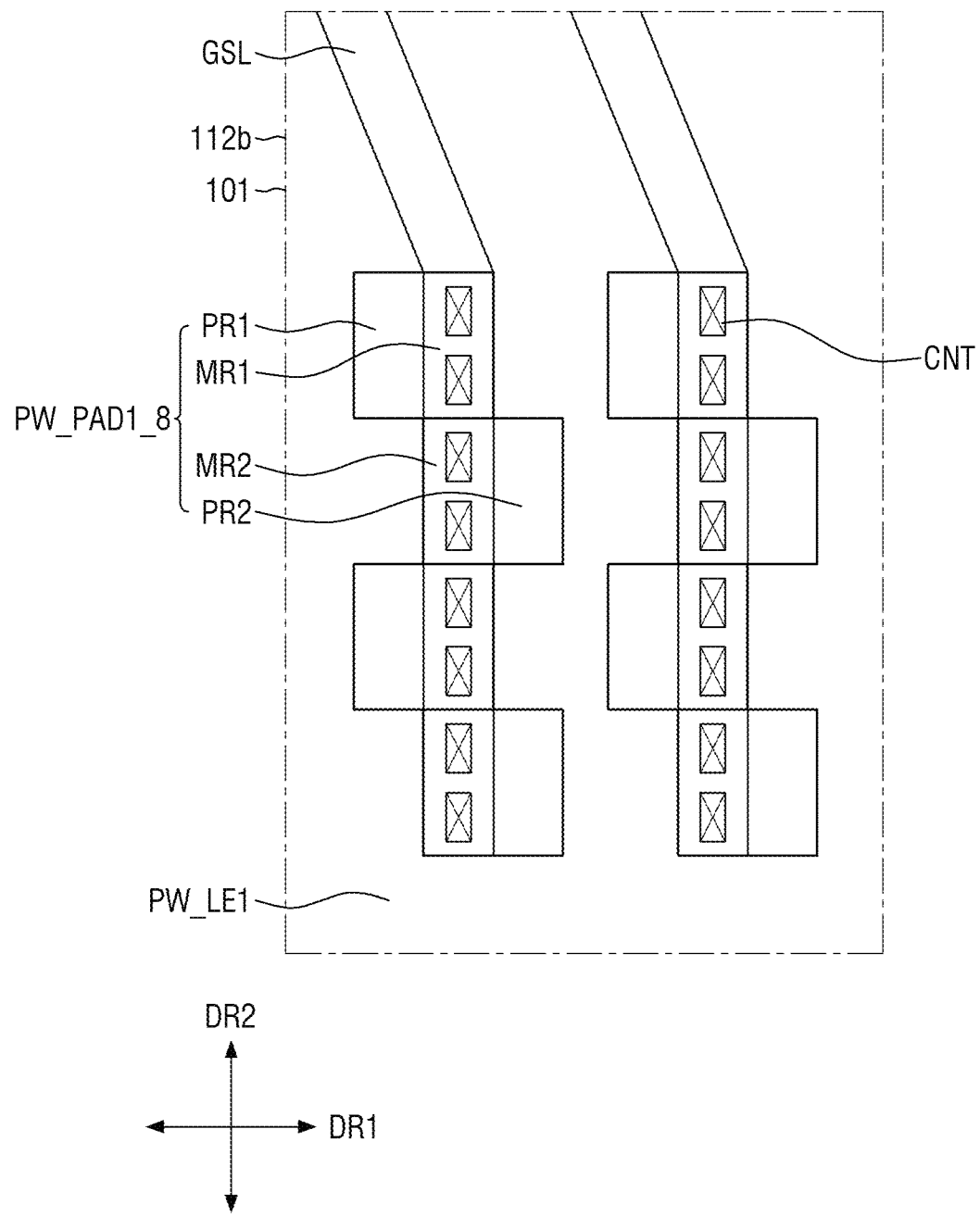
FIG. 21 is an enlarged plan view illustrating another exemplary embodiment of a pad area of a display device according to the invention.

FIG. 21 is an enlarged plan view illustrating another exemplary embodiment of a pad area of a display device according to the invention.

Referring to FIG. 21, in each first power pad PW_PAD1_8, no pad connecting portions may be provided between first main pad portions MR1 and second main pad portions MR2, and the first main pad portions MR1 and the second main pad portions MR2 may be directly connected physically.

In the exemplary embodiment of FIG. 21, even when misalignment occurs in the process of aligning lead wires with panel pads, the sum of the areas where first protruding pad portions PR1 and second protruding pad portions PR2 of each of the first power pads PW_PAD1_7 may be surface-bonded may be uniformly maintained. Therefore, bonding defects and resistance irregularities that may occur between the lead wires and the panel pads may be prevented, or at least alleviated.

Figure 22:
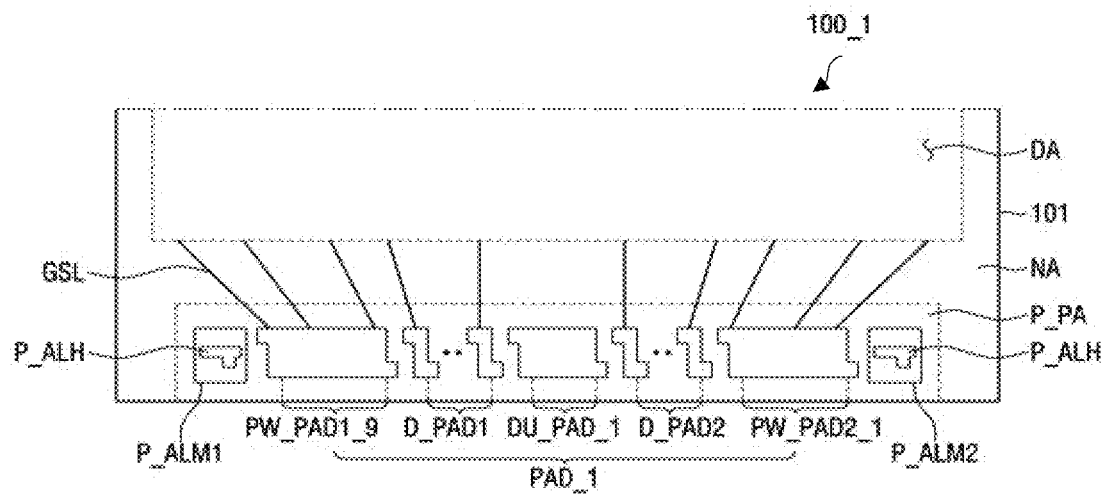
FIG. 22 is an enlarged plan view illustrating another exemplary embodiment of a pad area of a display device according to the invention.
Figure 23:
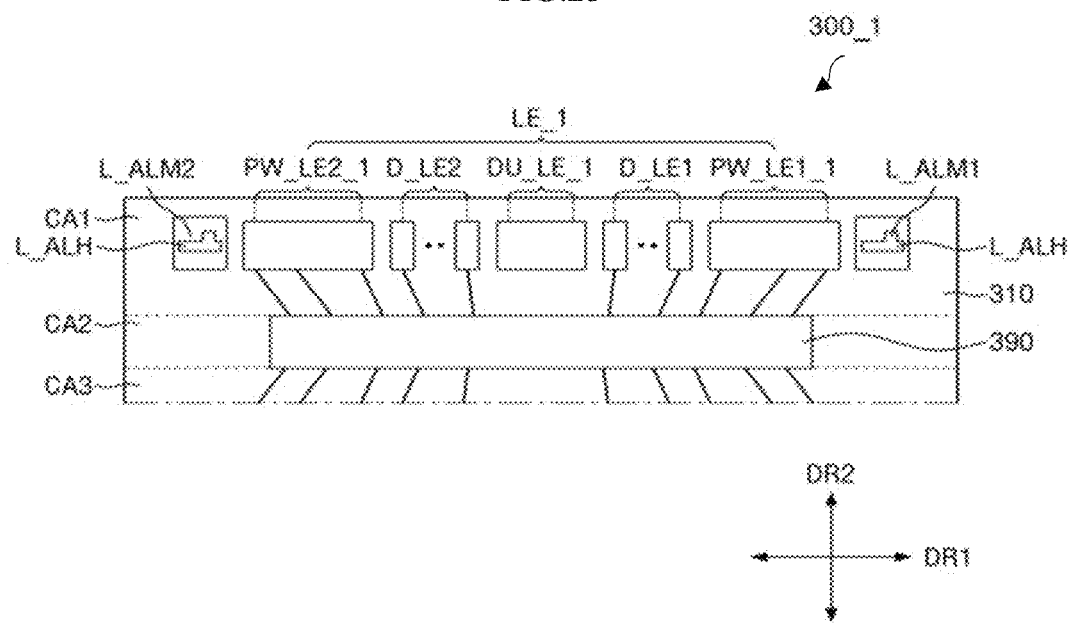
FIG. 23 is a partial plan view illustrating another exemplary embodiment of a PCB of a display device according to the invention.

FIG. 22 is an enlarged plan view illustrating another exemplary embodiment of a pad area of a display device according to the invention, and FIG. 23 is a partial plan view illustrating another exemplary embodiment of a PCB of a display device according to the invention.

Wire pads PAD_1 and lead wires LE_1 of FIGS. 22 and 23 differ from the wire pads PAD and the lead wires LE of FIGS. 3 and 4 in that first and second power pads PW_PAD1_9 and PW_PAD2_1, a panel dummy pad DU_PAD_1, first and second power lead wires PW_LE1_1 and PW_LE2_1, a dummy lead DU_LE_1 are unitary along a first direction DR1.

In an exemplary embodiment, referring to FIG. 22, main pad portions and a pad connecting portion of the first power pad PW_PAD1_9 are provided in one integral body along the first direction DR1, for example. Protruding pad portions of the first power pad PW_PAD1_9, like the protruding pad portions of each of the first power pads PW_PAD1 of FIG. 3, may protrude from one side and the other side, in the first direction DR1, of the main pad portion of the first power pad PW_PAD1_9 and may have the same area and completely the same profile in a plan view.

In the exemplary embodiment of FIGS. 22 and 23, the first and second power pads PW_PAD1_9 and PW_PAD2_1, which are unitary, overlap, in a thickness direction, with, and are surface-bonded to, the first and second power lead wires PW_LE1_1 and PW_LE2_1, respectively, which are unitary, and the panel dummy pad DU_PAD_1, which is unitary, overlaps, in the thickness direction, with, and is surface-bonded to, the dummy lead DU_LE_1, which is unitary. Accordingly, the size of areas where the wire pads PAD_1 and lead wires LE_1 may be surface-bonded together may be increased, and as a result, bonding defects may be prevented in advance.

Figure 24:
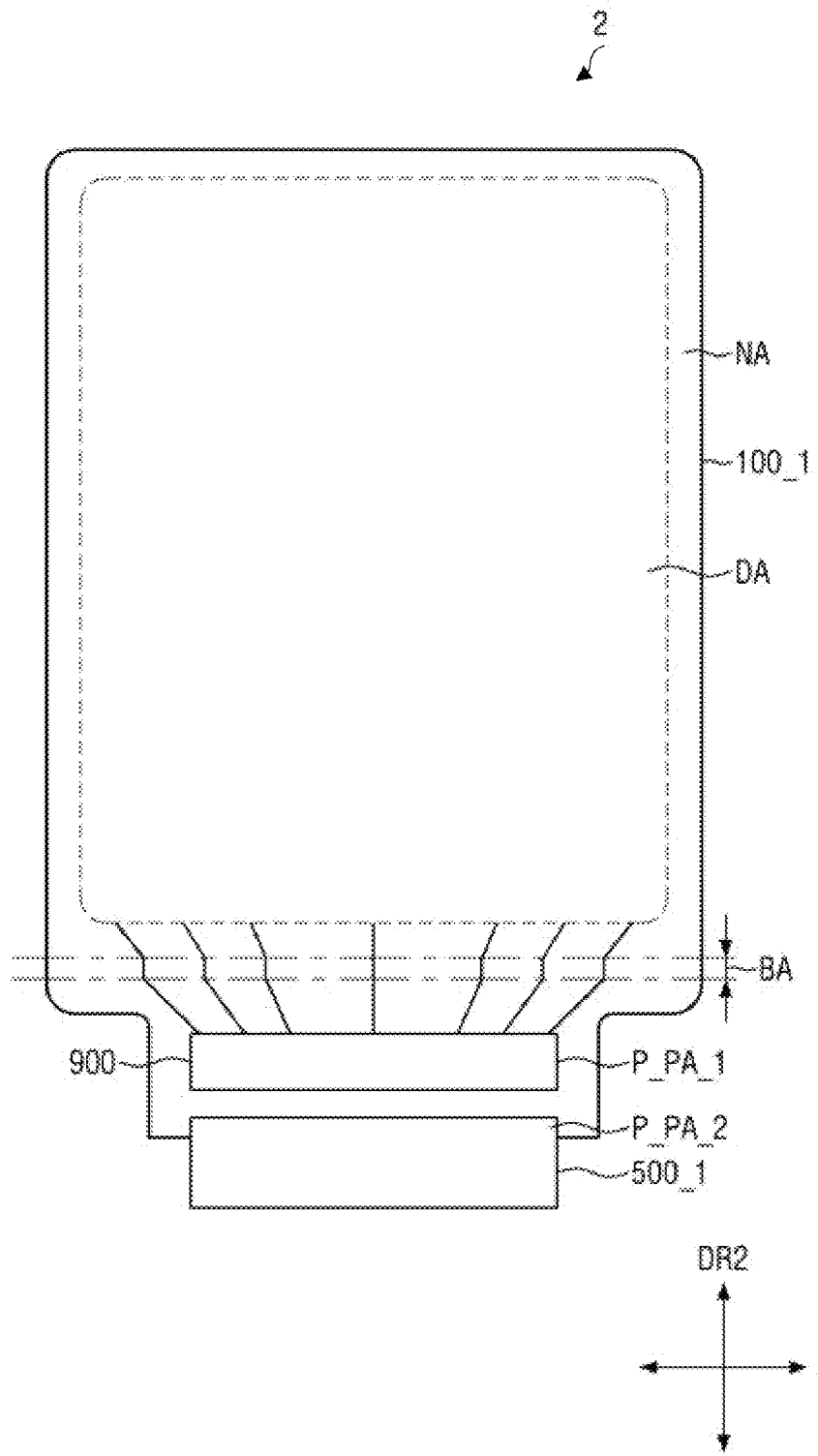
FIG. 24 is a plan view of another exemplary embodiment of a display device according to the invention.
Figure 25:
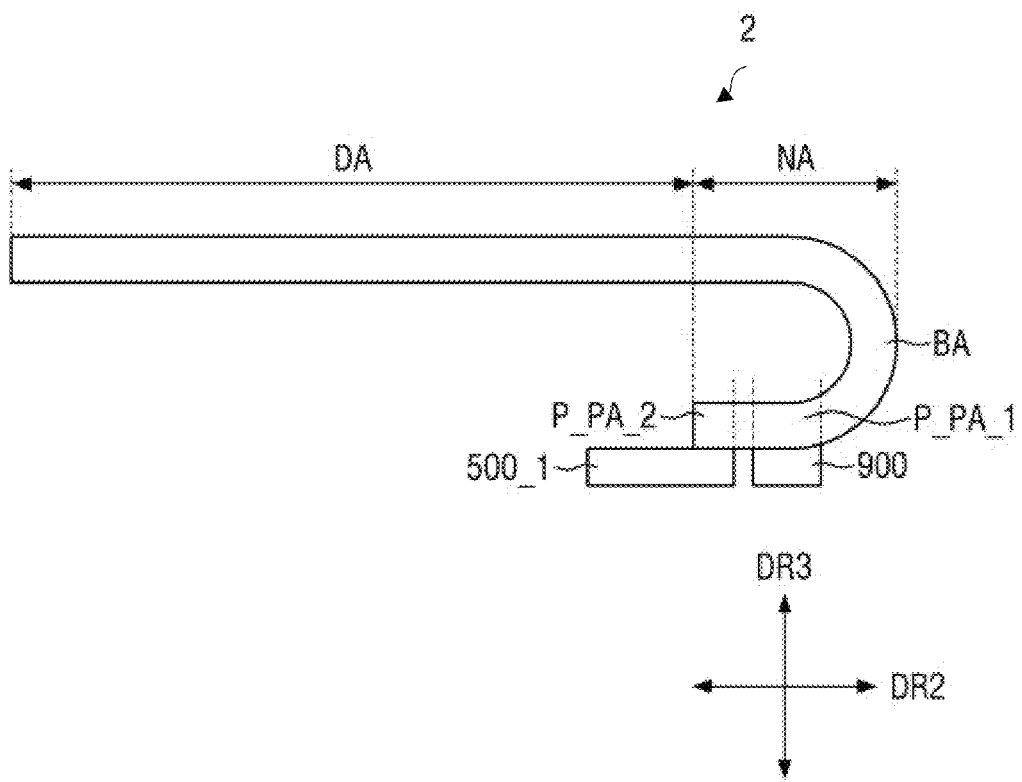
FIG. 25 is a cross-sectional view of another exemplary embodiment of a display device according to the invention.

FIG. 24 is a plan view of another exemplary embodiment of a display device according to the invention, and FIG. 25 is a cross-sectional view of another exemplary embodiment of a display device according to the invention.

Referring to FIGS. 24 and 25, a display panel 100_1 of a display device 2 may further include a bending area BA.

A display substrate 101 (refer to FIG. 2) of a display panel 100_1 may include an insulating material such as a polymer resin. In an exemplary embodiment, the polymer material may include polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("CAT"), cellulose acetate propionate ("CAP"), or a combination thereof, for example. The display substrate 101 may be a flexible substrate that is bendable, foldable, or rollable. The flexible substrate may include, for example, PI, but the invention is not limited thereto.

The bending area BA may be disposed between an array of a plurality of pixels and a first panel pad area P_PA_1. The bending area BA may be disposed in a non-display area NA. The display panel 100_1 may be folded in one direction along a bending line, which is a reference line disposed in the bending area BA. The bending line may be a straight line parallel to the lower (or upper) side of the display panel 100_1. As illustrated in FIG. 25, the bending area BA of the display panel 100_1 may be bended downward in a third direction DR3.

However, the invention is not limited thereto. That is, the display area DA and the first panel pad area P_PA_1 may be connected to each other without the bending area BA. In other words, the display panel 100_1 may not have the bending area BA and may be flat throughout the entire display area DA and the entire non-display area NA.

In the first panel pad area P_PA_1, a plurality of wire pads PAD are disposed. A driver IC 900 is disposed on the wire pads PAD. In a second panel pad area P_PA_2, a plurality of panel pads may be disposed, and a main circuit board 500_1 may be attached to the panel pads.

In an exemplary embodiment, the driver IC 900 may be implemented in a chip-on-plastic ("COP") or chip-on-glass ("COG") manner, for example.

The driver IC 900 may include a plurality of bumps which are connected to the wire pads PAD. In an exemplary embodiment, the bumps may include at least one of Au, Ni, and tin (Sn), for example.

The bumps of the driver IC 900 may be in direct contact with, and coupled to, the wire pads PAD without requiring another layers or elements. The bumps of the driver IC 900 and the wire pads PAD may be coupled together through ultrasonic bonding.

What is claimed is:

1. A display device comprising:
   a display substrate including a display area and a pad area, which is disposed on a periphery of the display area; and
   a wire pad, which is disposed in the pad area of the display substrate, the wire pad including:
      a main pad portion, which extends in a first direction and defined by a first side and a second side both extending in the first direction, each of the first side and the second side including a first portion and a second portion; and
      a plurality of protruding pad portions, which protrude from the first portion of the first side or the first portion of the second side, in a second direction intersecting the first direction, of the main pad portion;
   wherein the first portions of the first side and the second side are portions from which the plurality of protruding pad portions protrude in the second direction,
   the second portions of the first side and the second side are portions from which the plurality of protruding pad portions do not protrude in the second direction,
   the plurality of protruding pad portions include a first protruding pad portion which protrudes from the first portion of the first side facing the second portion of the second side, and a second protruding pad portion which protrudes from the first portion of the second side facing the second portion of the first side, and
   the first protruding pad portion is disposed closer than the second protruding pad portion to the display area.

2. The display device of claim 1, wherein
   the first direction is a direction from the display area toward an end of the pad area where the wire pad is disposed, and
   the second side, in the second direction, of the main pad portion is opposite to the first side, in the second direction, of the main pad portion.

3. The display device of claim 2, wherein the plurality of pad portions further include a third protruding pad portion, which protrudes from the first portion of the first side and separated from the first protruding portion, and a fourth protruding pad portion, which protrudes from the first portion of the second side and separated from the second protruding portion.

4. The display device of claim 3, wherein the third protruding pad portion is disposed between the second and fourth protruding pad portions and is disposed closer than the fourth protruding pad portion to the display area.

5. The display device of claim 3, wherein
the second protruding pad portion is disposed between the third and fourth protruding pad portions, and
the third protruding pad portion is disposed closer than the fourth protruding pad portion to the display area.

6. The display device of claim 2, wherein
the plurality of protruding pad portions further include a third protruding pad portion, which protrudes from the first portion of the second side and separated from the second protruding portion, and
an area of the first protruding pad portion is the same as areas of the second and third protruding pad portions.

7. The display device of claim 2, wherein the main pad portion includes a first sub-main pad portion, which is disposed on a second side, in the second direction, of the first protruding pad portion, and a second sub-main pad portion, which is disposed on a first side, in the second direction, of the second protruding pad portion and is spaced apart from the first sub-main pad portion in the first direction.

8. The display device of claim 2, wherein the first and second protruding pad portions have the same area and the same shape with each other.

9. The display device of claim 2, further comprising:
a printed circuit board attached on the pad area of the display substrate and including a lead wire, which is connected to the wire pad.

10. The display device of claim 9, wherein the lead wire overlaps with the main pad portion of the wire pad in a thickness direction and at least partially overlaps with at least one of the first protruding pad portion and the second protruding pad portion in the thickness direction.

11. The display device of claim 9, wherein the lead wire is directly connected to the wire pad.

12. The display device of claim 11, wherein the lead wire is ultrasonic-bonded to the wire pad.

13. The display device of claim 2, wherein
the wire pad overlaps, in a thickness direction, with, and is electrically connected to, a signal wire, which passes through the display area, and
the signal wire is a gate signal wire.

14. The display device of claim 13, further comprising:
a pad insulating film which is disposed between the signal wire and the wire pad of the pad area and in which a plurality of contact holes which at least partially expose the signal wire is defined,
wherein the wire pad is electrically connected to the signal wire through the plurality of contact holes.

15. The display device of claim 2, wherein a plurality of wire pads is arranged along the second direction and include a power wire pad, which is electrically connected to a power voltage line in the display area through a signal wire, and a data wire pad, which is electrically connected to a data line in the display area through the signal wire.

16. The display device of claim 15, further comprising:
a panel alignment mark which is disposed on a first side, in the second direction, of an array of the plurality of wire pads and in which an alignment hole is defined.

17. The display device of claim 16, further comprising:
a printed circuit board which includes a circuit alignment mark, which is ultrasonic-bonded to the panel alignment mark and in which a circuit alignment hole is defined.

18. A display device including a display area, which includes a thin-film transistor, and a pad area, which is disposed on a periphery of the display area, the display device comprising:
a substrate;
a first conductive layer disposed on the substrate, the first conductive layer including a gate electrode of the thin-film transistor, which is disposed in the display area, and a gate signal wire, which is disposed in the pad area;
a first insulating layer disposed on the first conductive layer;
a second conductive layer disposed on the first insulating layer, the second conductive layer including source and drain electrodes of the thin-film transistor and a plurality of wire pads which are disposed in the pad area;
a second insulating layer disposed on the second conductive layer; and
a third conductive layer disposed on the second insulating layer,
wherein
the plurality of wire pads overlaps, in a thickness direction, with, and is electrically connected to, the gate signal wire, each of the plurality of wire pads including:
a main pad portion, which extends in a first direction and defined by a first side and a second side both extending in the first direction, each of the first side and the second side including a first portion and a second portion; and
a plurality of protruding pad portions, which protrude from the first portion of the first side or the second portion of the second side, in a second direction which intersects the first direction, of the main pad portion;
the first portions of the first side and the second side are portions from which the plurality of protruding pad portions protrude in the second direction,
the second portions of the first side and the second side are portions from which the plurality of protruding pad portions do not protrude in the second direction,
the plurality of protruding pad portions include a first protruding pad portion which protrudes from the first portion of the first side facing the second portion of the second side, and a second protruding pad portion which protrudes from the first portion of the second side facing the second portion of the first side, and
the first protruding pad portion is disposed closer than the second protruding pad portion to the display area.

19. The display device of claim 18, wherein
the first direction is a direction from the display area toward an end of the pad area where the plurality of wire pads is disposed, and
the second side, in the second direction, of the main pad portion is opposite to the first side, in the second direction, of the main pad portion.

20. The display device of claim 19, further comprising:
a printed circuit board attached on the pad area of the display substrate and including lead wires, which are connected to the plurality of wire pads,
wherein the lead wires overlap with main pad portions of the plurality of wire pads in the thickness direction and at least partially overlap with at least one of first protruding pad portions and second protruding pad portions of the plurality of wire pads in the thickness direction.

* * * * *